(12) United States Patent
Watanabe et al.

(10) Patent No.: US 7,645,559 B2
(45) Date of Patent: Jan. 12, 2010

(54) POSITIVE RESIST COMPOSITION AND METHOD OF FORMING RESIST PATTERN

(75) Inventors: Ryoji Watanabe, Kawasaki (JP); Masaru Takeshita, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 116 days.

(21) Appl. No.: 12/064,288

(22) PCT Filed: Aug. 16, 2006

(86) PCT No.: PCT/JP2006/316083

§ 371 (c)(1), (2), (4) Date: Feb. 20, 2008

(87) PCT Pub. No.: WO2007/039989

PCT Pub. Date: Apr. 12, 2007

(65) Prior Publication Data

US 2009/0246683 A1    Oct. 1, 2009

(30) Foreign Application Priority Data

Aug. 23, 2005 (JP) .............................. 2005-241014

(51) Int. Cl.
*G03F 7/004* (2006.01)
*G03F 7/30* (2006.01)

(52) U.S. Cl. ..................... 430/270.1; 430/326; 430/910; 430/921

(58) Field of Classification Search .............. 430/270.1, 430/326, 910, 921
See application file for complete search history.

(56) References Cited

U.S. PATENT DOCUMENTS

| | | | |
|---|---|---|---|
| 5,945,517 A | 8/1999 | Nitta et al. | |
| 6,153,733 A | 11/2000 | Yukawa et al. | |
| 6,664,022 B1 | 12/2003 | Cameron et al. | |
| 7,494,762 B2 * | 2/2009 | Irie et al. | 430/270.1 |
| 2002/0177068 A1 | 11/2002 | Park et al. | |
| 2003/0013049 A1 * | 1/2003 | Cameron et al. | 430/326 |
| 2004/0110085 A1 | 6/2004 | Iwai et al. | |
| 2005/0095535 A1 | 5/2005 | Iwai et al. | |
| 2006/0127806 A1 | 6/2006 | Iwai et al. | |
| 2006/0127807 A1 | 6/2006 | Iwai et al. | |
| 2006/0127808 A1 | 6/2006 | Iwai et al. | |
| 2006/0134552 A1 | 6/2006 | Iwai et al. | |
| 2006/0134553 A1 | 6/2006 | Iwai et al. | |
| 2007/0190455 A1 | 8/2007 | Iwai et al. | |

FOREIGN PATENT DOCUMENTS

| | | |
|---|---|---|
| JP | H09-208554 | 8/1997 |
| JP | H11-035551 | 2/1999 |
| JP | H11-035552 | 2/1999 |
| JP | H11-035573 | 2/1999 |
| JP | H11-322707 | 11/1999 |
| JP | 2000-181054 | 6/2000 |
| JP | 2002-363225 | 12/2002 |
| JP | 2004-521372 | 7/2004 |
| JP | 2005-29548 | 2/2005 |
| TW | 200426511 A | 12/2004 |
| WO | WO 2004/074242 | 9/2004 |

OTHER PUBLICATIONS

International Search Report in connection with corresponding PCT application No. PCT/JP2006/316083, dated Sep. 19, 2006.
Ogata et al., *Effects of Protecting Group on Resist Characteristics of Acryl Polymers for 193 nm Lithography*, Journal of Photopolymer Science and Technology, vol. 17 No. 4, p483-488, (2004).
Office Action issued in counterpart Taiwanese Patent Application No. 095130254, dated Oct. 16, 2009.

* cited by examiner

*Primary Examiner*—John S Chu
(74) *Attorney, Agent, or Firm*—Knobbe, Martens, Olson & Bear, LLP

(57) ABSTRACT

A positive resist composition and method of forming a resist pattern are provided which enable formation of a resist pattern having excellent shape with reduced LWR.

The positive resist composition includes a resin component (A) which exhibits increased alkali solubility under action of acid and an acid-generator component (B) which generates acid upon irradiation, the resin component (A) having a structural unit (a1) which has an acetal-type protection group, and the acid-generator component (B) including an acid generator (B1) having a cation moiety represented by general formula (b-5) shown below:

[Chemical Formula 1]

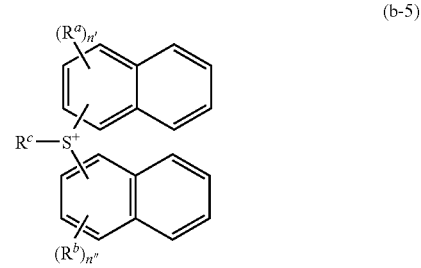

(b-5)

wherein $R^a$ and $R^b$ each independently represents an alkyl group, an alkoxy group, a halogen atom or a hydroxyl group; $R^c$ represents an aryl group or alkyl group which may or may not have a substituent; and n' and n" each independently represents an integer of 0 to 3.

5 Claims, No Drawings

POSITIVE RESIST COMPOSITION AND METHOD OF FORMING RESIST PATTERN

RELATED APPLICATIONS

This application is the U.S. National Phase filing under 35 U.S.C. §371 of PCT/JP2006/316083, filed Aug. 16, 2006, which designated the United States and was published in a language other than English, which claims priority under 35 U.S.C. §119(a)-(d) to Japanese Patent Application No. 2005-241014, filed Aug. 23, 2005. The content of these applications is incorporated herein by reference in their entireties.

TECHNICAL FIELD

The present invention relates to a positive resist composition and a method of forming a resist pattern.

BACKGROUND ART

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film.

A resist material in which the exposed portions become soluble in the developing solution is called a positive-type, and a resist material in which the exposed portions become insoluble in the developing solution is called a negative-type.

In recent years, in the production of semiconductor elements and liquid crystal display elements, advances in lithography techniques have lead to rapid progress in the field of miniaturization.

Typically, these miniaturization techniques involve shortening the wavelength of the exposure light source. Conventionally, ultraviolet radiation typified by g-line and i-line radiation has been used, but nowadays KrF excimer lasers and ArF excimer lasers are now starting to be introduced in mass production.

Furthermore, research is also being conducted into lithography techniques that use exposure light source having a wavelength shorter than these excimer lasers, such as $F_2$ excimer lasers, electron beam, extreme ultraviolet radiation (EUV), X ray and the like.

Resist materials for use with these types of exposure light sources require lithography properties such as a high resolution capable of reproducing patterns of minute dimensions, and a high level of sensitivity to these types of exposure light sources.

As a resist material which satisfies these conditions, a chemically amplified resist is used, which includes a base resin that exhibits a changed alkali solubility under action of acid and an acid generator that generates acid on exposure. For example, a chemically amplified positive resist contains, as a base resin, a resin which exhibits increased alkali solubility under action of acid, and an acid generator. In the formation of a resist pattern, when acid is generated from the acid generator upon exposure, the exposed portions become alkali soluble.

Until recently, polyhydroxystyrene (PHS) or derivative resins thereof in which the hydroxyl groups are protected with acid-dissociable, dissolution-inhibiting groups (PHS-based resins), which exhibit high transparency to a KrF excimer laser (248 nm), have been used as the base resin component of chemically amplified resists. However, because PHS-based resins contain aromatic rings such as benzene rings, their transparency is inadequate for light with wavelengths shorter than 248 nm, such as light of 193 nm. Accordingly, chemically amplified resists that use a PHS-based resin as the base resin component suffer from low levels of resolution in processes that use light of 193 nm.

As a result, resins that contain structural units derived from (meth)acrylate esters within the principal chain (acrylic resins) are now widely used as base resins for resists that use ArF excimer laser lithography, as they exhibit excellent transparency in the vicinity of 193 nm (see, for example, Patent Document 1).

Further, with respect to the acid generator (PAG), specifically, as described in Patent Document 1, onium salts have been mainly used, and an onium salt-based acid generator having a plurality of phenyl groups such as triphenylsulfonium nonafluorobutanesulfonate have been most widely used.

[Patent Document 1] Japanese Unexamined Patent Application, First Publication No. 2003-241385

DISCLOSURE OF INVENTION

Means To Solve The Problems

However, when a conventional resist composition is used to form a resist pattern, problems were caused such as line width roughness (hereafter, abbreviated as "LWR") in which the line width of a line pattern becomes heterogeneous.

Especially in recent years, as requirements for high resolution of resist patterns increases, further improvement in LWR of the resist pattern formed following developing is desired.

The present invention takes the above circumstances into consideration, with an object of providing a positive resist composition and method of forming a resist pattern which enables formation of a resist pattern having excellent shape with reduced LWR.

Means To Solve The Problems

A first aspect of the present invention is a positive resist composition including a resin component (A) which exhibits increased alkali solubility under action of acid and an acid-generator component (B) which generates acid upon irradiation, the resin component (A) having a structural unit (a1) which is at least one member selected from the group consisting of structural units represented by general formula (a1-2) or (a1-4) shown below:

[Chemical Formula 1]

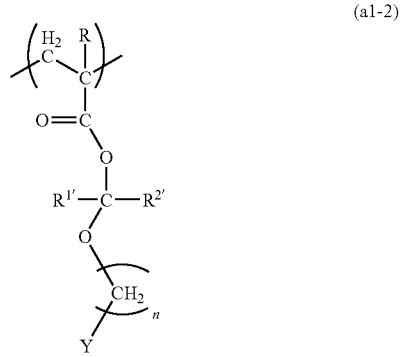

(a1-2)

-continued

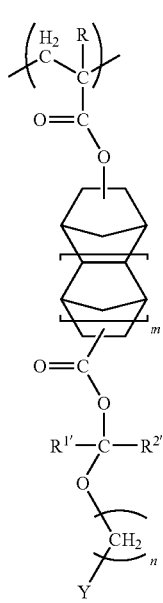

(a1-4)

wherein Y represents a lower alkyl group or an aliphatic cyclic group; n represents an integer of 0 to 3; m represents 0 or 1; R represents a hydrogen atom, a halogen atom, a lower alkyl group or a halogenated lower alkyl group; and $R^{1'}$ and $R^{2'}$ each independently represents a hydrogen atom or a lower alkyl group; and the acid-generator component (B) including an acid generator (B1) having a cation moiety represented by general formula (b-5) shown below:

[Chemical Formula 2]

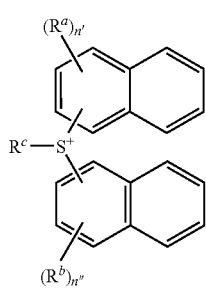

(b-5)

wherein $R^a$ and $R^b$ each independently represents an alkyl group, an alkoxy group, a halogen atom or a hydroxyl group; $R^c$ represents an aryl group or alkyl group which may or may not have a substituent; and n' and n" each independently represents an integer of 0 to 3.

Further, a second aspect of the present invention is a method of forming a resist pattern, including: applying a positive resist composition of the first aspect to a substrate to form a resist film on the substrate; conducting exposure of the resist film; and developing the resist film to form a resist pattern.

In the present invention, the term "structural unit" refers to a monomer unit that contributes to the formation of a resin component (polymer).

The term "exposure" is used as a general concept that includes irradiation with any form of radiation.

Effect of the Invention

According to the present invention, there are provided a positive resist composition and method of forming a resist pattern which enable formation of a resist pattern having excellent shape with reduced LWR.

BEST MODE FOR CARRYING OUT THE INVENTION

<<Positive Resist Composition>>

The positive resist composition of the present invention includes a resin component (A) (hereafter, frequently referred to as "component A") which exhibits increased alkali solubility under action of acid and an acid-generator component (B) (hereafter, frequently referred to as "component (B)") which generates acid upon irradiation.

In the positive resist composition of the present invention, the component (A) is alkali-insoluble prior to exposure. When the acid generated from the component (B) upon exposure acts on the component (A), the acid dissociable, dissolution inhibiting groups are dissociated and the alkali-solubility of the entire component (A) is enhanced. As a result, the positive resist composition changes from alkali-insoluble to alkali soluble. Therefore, in the formation of a resist pattern, when a resist film obtained by using the positive resist composition is subjected to selective exposure, the exposed portions become soluble in an alkali, while the unexposed portions remain alkali-insoluble, and hence a resist pattern can be formed by developing with an alkali.

<Component (A)>

In the present invention, the component (A) has a structural unit (a1) which is at least one member selected from the group consisting of structural units represented by general formula (a1-2) or (a1-4) shown above. These structural units are derived from an acrylate ester.

In the present descriptions and the claims, the term "structural unit derived from an acrylate ester" refers to a structural unit which is formed by the cleavage of the ethylenic double bond of an acrylate ester.

The term "acrylate ester" is a generic term that includes acrylate esters having a hydrogen atom bonded to the carbon atom on the α-position, and acrylate esters having a substituent (an atom other than a hydrogen atom or a group bonded to the carbon atom on the α-position). As the substituent, a halogen atom, a lower alkyl group or a halogenated lower alkyl group can be mentioned. Examples of halogen atoms include a fluorine atom, a chlorine atom, a bromine atom and a iodine atom, and a fluorine atom is particularly desirable.

With respect to the "structural unit derived from an acrylate ester", the "α-position (the carbon atom on the α-position)" refers to the carbon atom having the carbonyl group bonded thereto, unless specified otherwise.

An "alkyl group" includes a linear, branched or cyclic, monovalent saturated hydrocarbon, unless specified otherwise.

A "lower alkyl group" refers to an alkyl group of 1 to 5 carbon atoms.

With respect to the acrylate ester, specific examples of the lower alkyl group for the substituent at the α-position include linear or branched alkyl groups such as a methyl group, ethyl group, propyl group, isopropyl group, n-butyl group, isobutyl group, tert-butyl group, pentyl group, isopentyl group, and neopentyl group.

In the present invention, it is preferable that a hydrogen atom, a halogen atom, a lower alkyl group or a halogenated lower alkyl group is bonded to the α-position of the acrylate ester, more preferably a hydrogen atom, a fluorine atom, a lower alkyl group or a fluorinated lower alkyl group. In terms of industrial availability, a hydrogen atom or a methyl group is particularly desirable.

Structural Unit (a1)

The structural unit (a1) is at least one member selected from the group consisting of structural units represented by general formula (a1-2) or (a1-4) shown above. In the present invention, by including a resin component (A) having the structural unit (a1), the effects of the present invention can be achieved, i.e., a resist pattern having an excellent shape with reduced LWR can be obtained.

The structural unit (a1) has an acetal group-type (alkoxyalkyl group-type) acid dissociable, dissolution inhibiting group represented by the formula: —C(R$^{1'}$)(R$^{2'}$)—O(CH$_2$)$_n$—Y bonded to the terminal oxygen atom of the carbonyloxy group (—C(O)—O—) derived from the carboxy group.

In general formulas (a1-2) and (a1-4), R represents a hydrogen atom, a halogen atom, a lower alkyl group or a halogenated lower alkyl group.

In general formulas (a1-2) and (a1-4), the halogen atom, lower alkyl group and halogenated lower alkyl group for R are the same as the halogen atom, lower alkyl group or halogenated lower alkyl group which can be bonded to the α-position of the aforementioned acrylate ester.

Fluorinated lower alkyl group which is preferable as the halogenated lower alkyl group is preferably a lower alkyl group of 1 to 5 carbon atoms in which some or all of the hydrogen atoms are substituted with fluorine atoms. In the present invention, those which have all of the hydrogen atoms fluorinated are preferable. As a fluorinated lower alkyl group, a linear or branched fluorinated lower alkyl group is preferable, a trifluoromethyl group, a hexafluoroethyl group, a heptafluoropropyl group or a nonafluorobutyl group is more preferable, and a trifluoromethyl group (—CF$_3$) is most preferable.

As R, a hydrogen atom, a trifluoromethyl group or a methyl group is preferable, and a methyl group is more preferable.

R$^{1'}$ and R$^{2'}$ each independently represents a hydrogen atom or a lower alkyl group. As the lower alkyl group for R$^{1'}$ and R$^{2'}$, any of those which are the same as the lower alkyl groups for R can be exemplified. In the present invention, it is preferable that at least one of R$^{1'}$ and R$^{2'}$ be a hydrogen atom, and it is more preferable that both of R$^{1'}$ and R$^{2'}$ are hydrogen atoms.

n represents an integer of 0 to 3, preferably an integer of 0 to 2, more preferably 0 or 1, and most preferably 0.

Y represents a lower alkyl group or an aliphatic cyclic group.

As the lower alkyl group for Y, any of those which are the same as the lower alkyl groups for R can be exemplified.

As the aliphatic cyclic group for Y, any one can be appropriately selected from monocyclic and polycyclic groups proposed for use in a conventional ArF resist or the like.

In the present description and claims, the term "aliphatic" is a relative concept used in relation to the term "aromatic", and defines a group or compound that has no aromaticity. Further, the term "aliphatic cyclic group" refers to a monocyclic group or polycyclic group that has no aromaticity.

The aliphatic cyclic group may or may not have a substituent. Examples of the substituent include lower alkyl groups of 1 to 5 carbon atoms, a fluorine atom, fluorinated lower alkyl groups of 1 to 5 carbon atoms, and an oxygen atom (═O).

The aliphatic cyclic group may be a hydrocarbon group (alicyclic group) in which the basic ring exclusive of substituents is constituted from only carbon and hydrogen, or a heterocyclic group in which some of the carbon atoms constituting the ring of the alicyclic group are replaced by hetero atoms (e.g., oxygen atom or nitrogen atom). The aliphatic cyclic group is preferably an alicyclic group.

The aliphatic cyclic group may be either saturated or unsaturated, but is preferably saturated.

Examples of aliphatic cyclic groups include mono cyclic groups of 5 to 7 carbon atoms and polycyclic groups of 10 to 16 carbon atoms. As aliphatic monocyclic groups of 5 to 7 carbon atoms, groups in which one hydrogen atom has been removed from a monocycloalkane can be exemplified. Specific examples of such aliphatic monocyclic groups include groups in which one hydrogen atom has been removed from cyclopentane or cyclohexane. As aliphatic polycyclic groups of 10 to 16 carbon atoms, groups in which one hydrogen atom has been removed from a bicycloalkane, tricycloalkane or tetracycloalkane can be exemplified. Specific examples of such aliphatic polycyclic groups include groups in which one hydrogen atom has been removed from a polycycloalkane such as adamantane, norbornane, isobornane, tricyclodecane or tetracyclododecane. Of these, aliphatic polycyclic groups are preferable, and in consideration of industrial applications, an adamantyl group, a norbonyl group or a tetracyclodecanyl group is preferable, although an adamantyl group is particularly desirable.

As specific examples of acid dissociable, dissolution inhibiting groups represented by general formula: —C(R$^{1'}$)(R$^{2'}$)—O(CH$_2$)$_n$—Y within formulas (a1-2) and (a1-4) shown above, those having structures represented by the following chemical formulas may be exemplified.

[Chemical Formula 3]

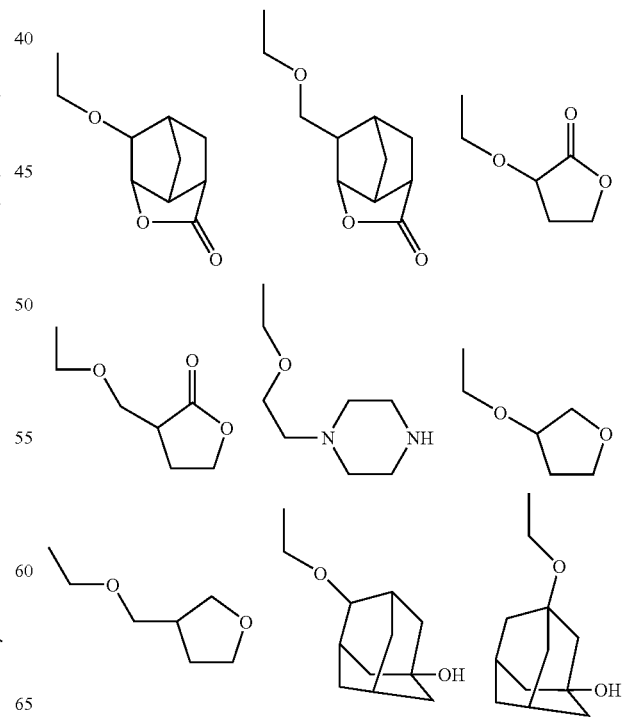

-continued
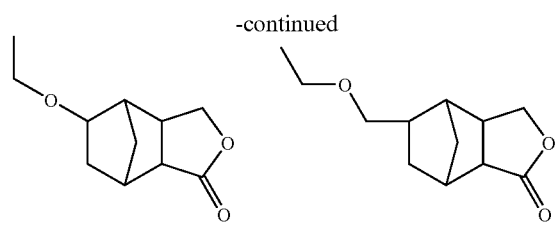
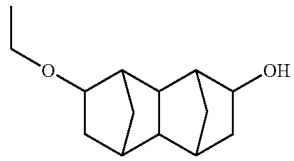
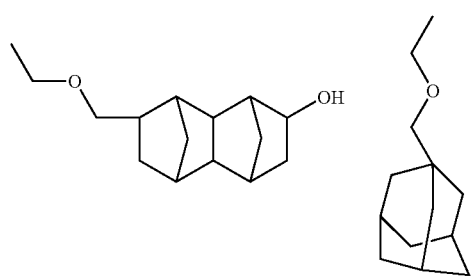
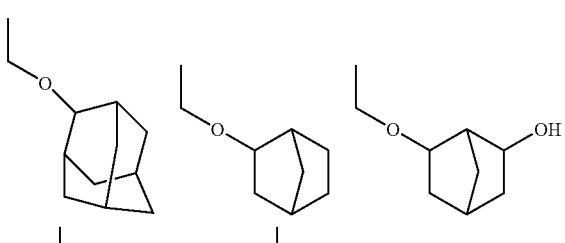
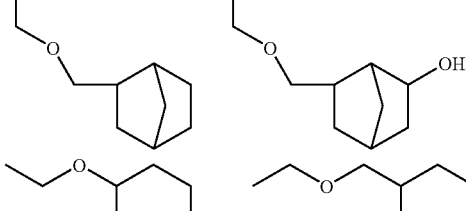
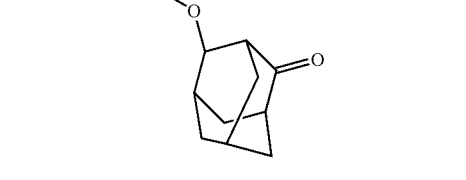
Specific examples of the structural units represented by the above-mentioned general formulas (a1-2) or (a1-4) are shown below.
[Chemical Formula 4]
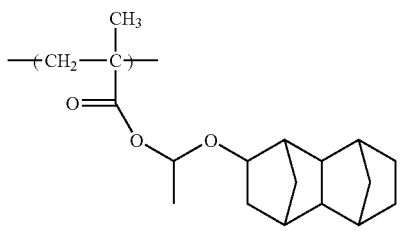
(a1-2-1)
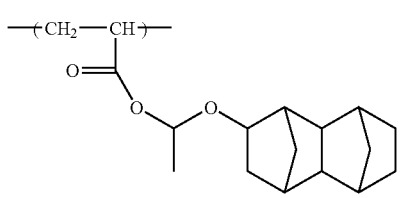
(a1-2-2)
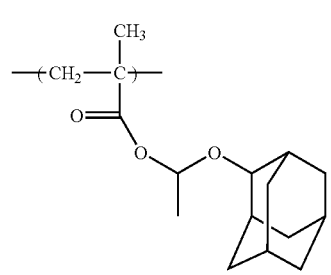
(a1-2-3)
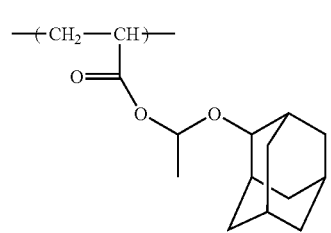
(a1-2-4)
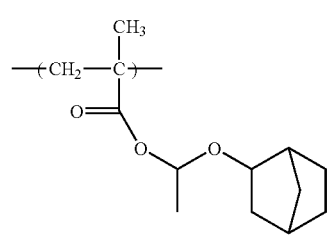
(a1-2-5)
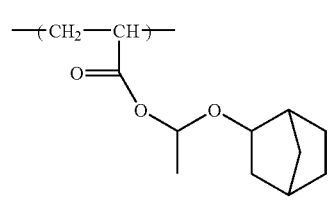
(a1-2-6)

[Chemical Formula 5]
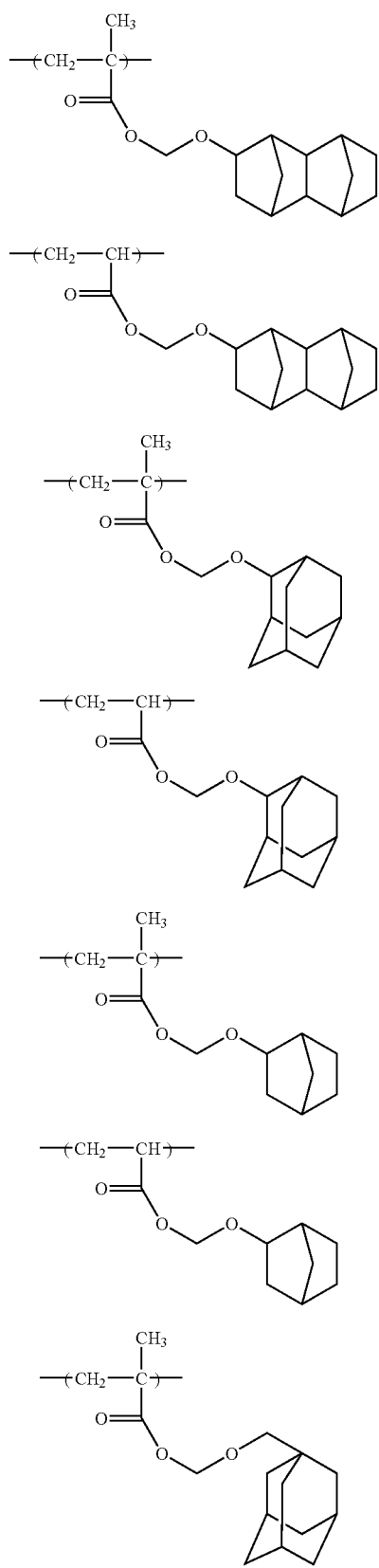
(a1-2-7)
(a1-2-8)
(a1-2-9)
(a1-2-10)
(a1-2-11)
(a1-2-12)
(a1-2-13)
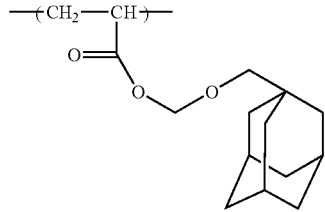
(a1-2-14)
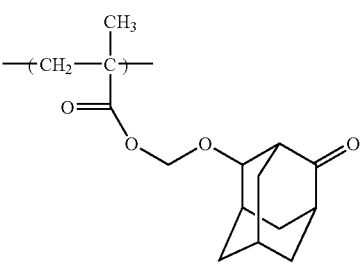
(a1-2-15)
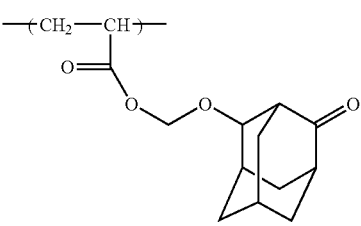
(a1-2-16)
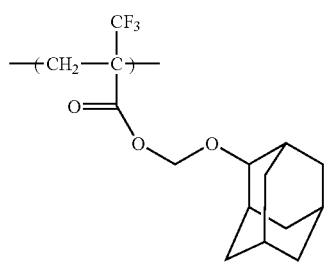
(a1-2-17)
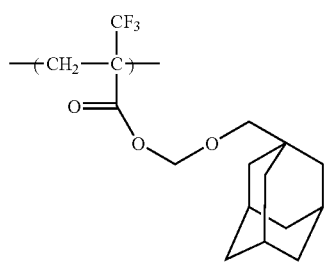
(a1-2-18)
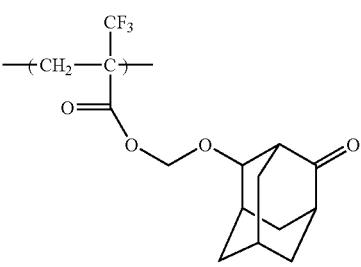
(a1-2-19)

(a1-2-20)
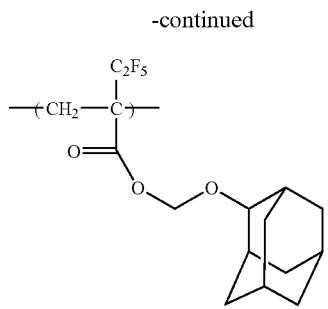
(a1-2-21)
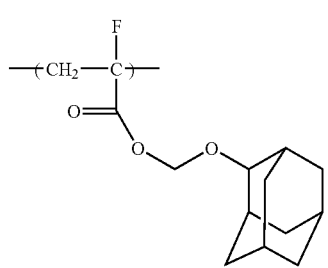
[Chemical Formula 6]
(a1-4-1)
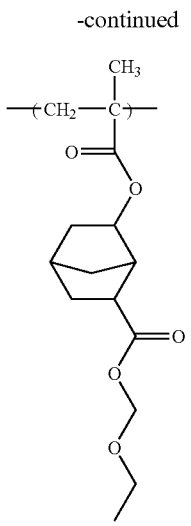
(a1-4-2)
(a1-4-3)
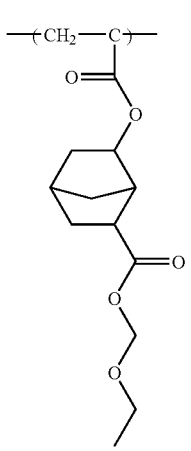
(a1-4-4)
(a1-4-5)
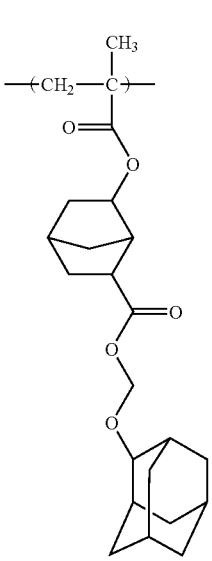

-continued (a1-4-6)

(a1-4-7)

(a1-4-8)

(a1-4-9)

(a1-4-10)

(a1-4-11)

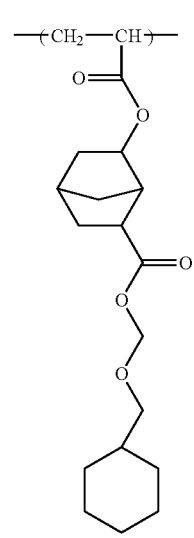
(a1-4-12)
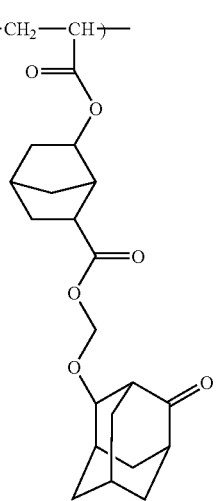
(a1-4-13)
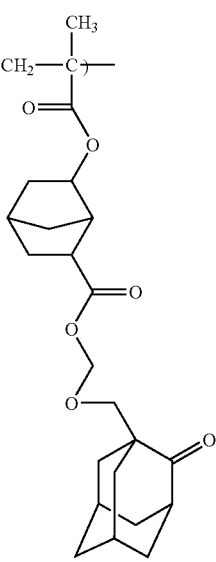
(a1-4-14)
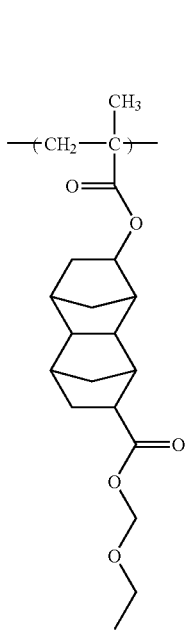
(a1-4-15)
[Chemical Formula 7]
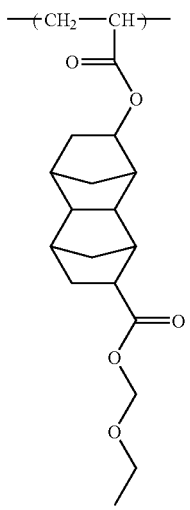
(a1-4-16)

(a1-4-17)

(a1-4-18)

(a1-4-19)

(a1-4-20)

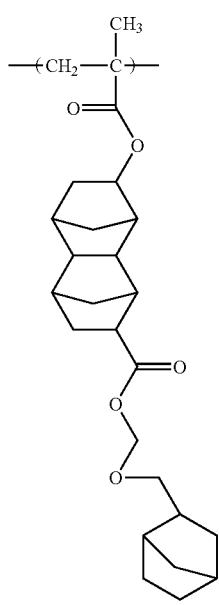 (a1-4-21)
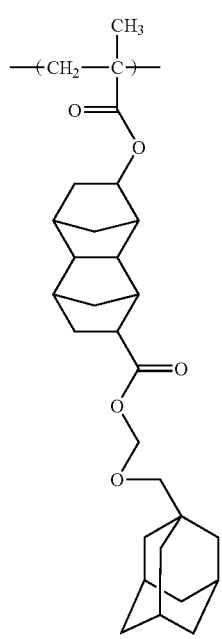 (a1-4-23)
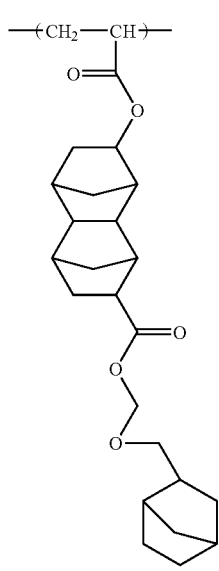 (a1-4-22)
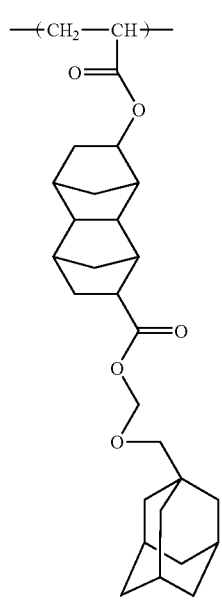 (a1-4-24)

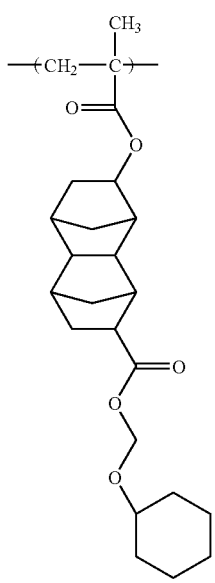
(a1-4-25)
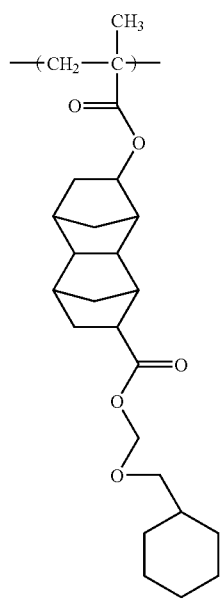
(a1-4-27)
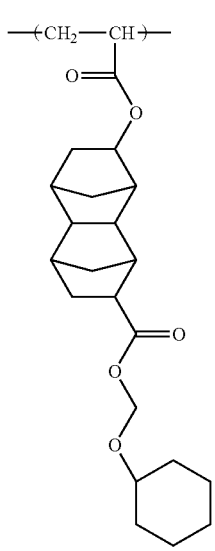
(a1-4-26)
(a1-4-28)

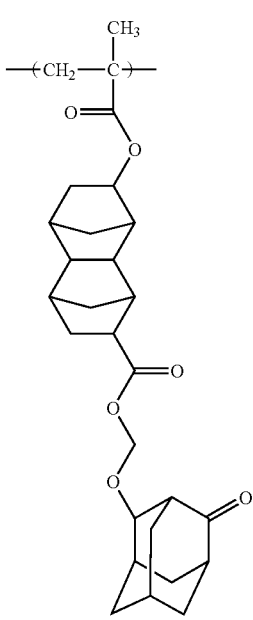

(a1-4-29)

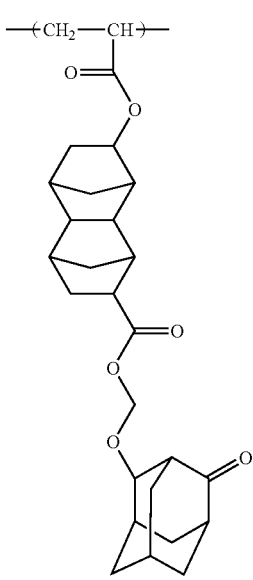

(a1-4-30)

As the structural unit (a1), a structural unit represented by general formula (a1-2) shown above is preferable, and a structural unit represented by general formula (2) shown below is more preferable.

[Chemical Formula 8]

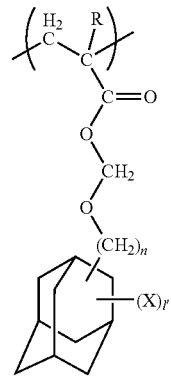

(2)

wherein R is as defined above; n represents an integer of 0 to 3; X represents a polar group; and l' represents an integer of 0 to 3.

In formula (2), R and n are as defined for formula (a1-2) above.

As a polar group for X, a hydroxyl group, a cyano group, a carboxy group, or a fluorinated hydroxyalkyl group which is a hydroxyalkyl group of 1 to 5 carbon atoms wherein some of the hydrogen atoms bonded to the carbon atom(s) are substituted with fluorine atoms. Among these, a hydroxyl group or a carboxy group is preferable. X is not particularly limited to monovalent groups, and an oxygen atom (=O; wherein the oxygen atom forms a carbonyl group with a carbon atom constituting the ring) is also preferable.

l' is preferably 0 or 1, and most preferably 0.

X is preferably an oxygen atom, and the number of oxygen atoms is preferably 1.

Among the structural units represented by general formula (2) above, those which are represented by general formula (3), (4) or (3)' shown below are preferable, and those represented by general formula (3) or (3)' are more preferable.

[Chemical Formula 9]

(3)

wherein R is as defined above,

[Chemical Formula 10]

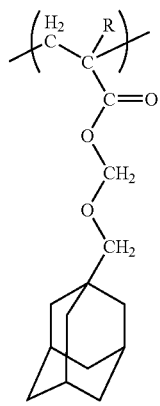

(4)

wherein R is as defined above.

[Chemical Formula 11]

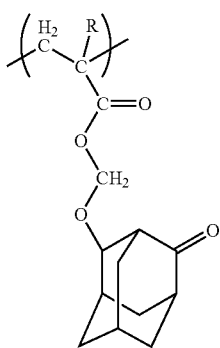

(3)′ wherein R is as defined above.

As the structural unit (a1), one type of structural unit selected from the group consisting of structural units represented by general formula (a1-2) or (a1-4) may be used, or two or more types may be used in combination.

In the component (A), the amount of the structural unit (a1) based on the combined total of all structural units constituting the component (A) is preferably 10 to 80 mol %, more preferably 20 to 70 mol %, still more preferably 25 to 50 mol %. By making the amount of the structural unit (a1) at least as large as the lower limit of the above-mentioned range, the effect of the present invention of obtaining a resist pattern having excellent shape with reduced LWR is improved, and a fine pattern can be obtained from a resist composition including the structural unit (a1). On the other hand, by making the amount of the structural unit (a1) no more than the upper limit of the above-mentioned range, a good balance can be achieved with the other structural units.

Structural Unit (a2)

The component (A) preferably has a structural unit (a2) derived from an acrylate ester having a lactone-containing cyclic group, as well as the structural unit (a1).

The term "lactone-containing cyclic group" refers to a cyclic group including one ring containing a —O—C(O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the component (A) is used for forming a resist film, the lactone-containing cyclic group of the structural unit (a2) is effective in improving the adhesion between the resist film and the substrate, and increasing hydrophilicity to enhance affinity to the developing solution.

As the structural unit (a2), there is no particular limitation, and an arbitrary structural unit may be used.

Specific examples of lactone-containing monocyclic groups include groups in which one hydrogen atom has been removed from γ-butyrolactone. Specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 12]

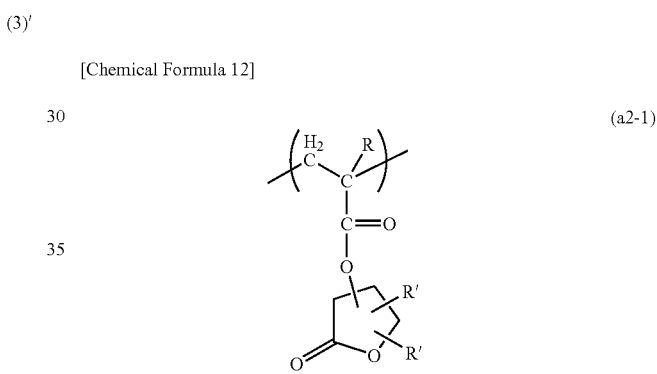

(a2-1)

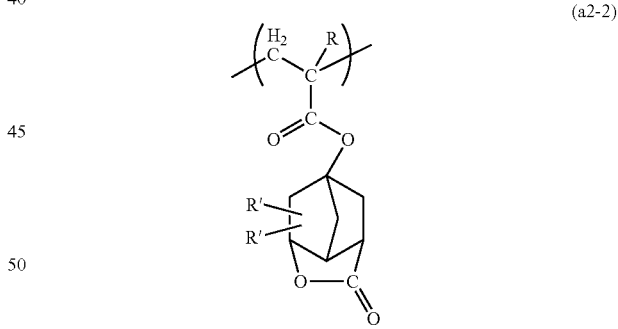

(a2-2)

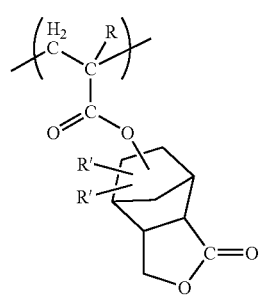

(a2-3)

-continued

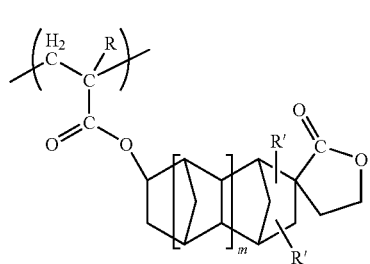
(a2-4)

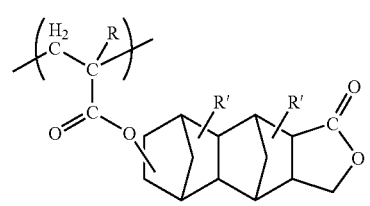
(a2-5)

wherein R represents a hydrogen atom, a halogen atom, a lower alkyl group or a halogenated lower alkyl group; R' represents a hydrogen atom, a lower alkyl group or an alkoxy group of 1 to 5 carbon atoms; and m represents 0 or 1.

In general formulas (a2-1) to (a2-5), R is the same as R in the structural unit (a1).

The lower alkyl group for R' is the same as the lower alkyl group for R in the structural unit (a1).

In the structural units represented by general formulas (a2-1) to (a2-5), in consideration of industrial availability, R' is preferably a hydrogen atom.

Specific examples of structural units represented by general formulas (a2-1) to (a2-5) above are shown below.

[Chemical Formula 13]

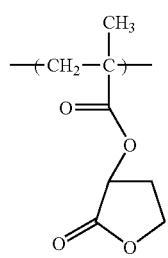
(a2-1-1)

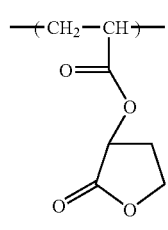
(a2-1-2)

-continued

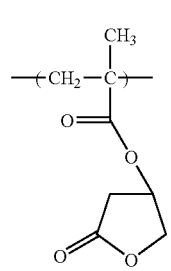
(a2-1-3)

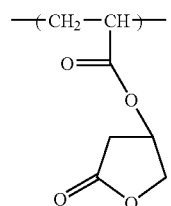
(a2-1-4)

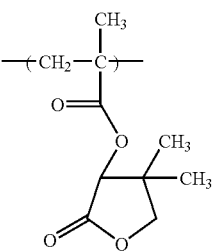
(a2-1-5)

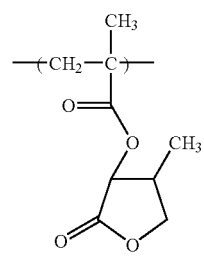
(a2-1-6)

[Chemical Formula 14]

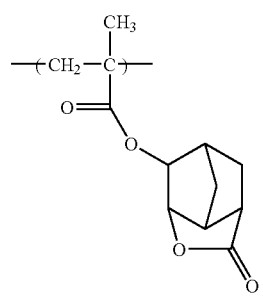
(a2-2-1)

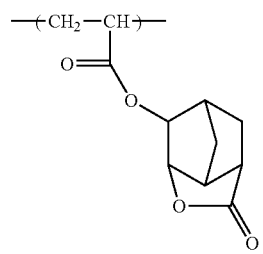
(a2-2-2)

-continued
(a2-2-3)
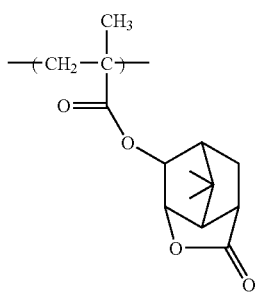
(a2-2-4)
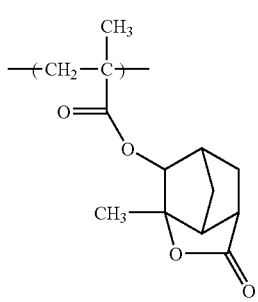
(a2-2-5)
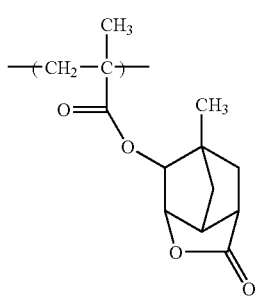
[Chemical Formula 15]
(a2-3-1)
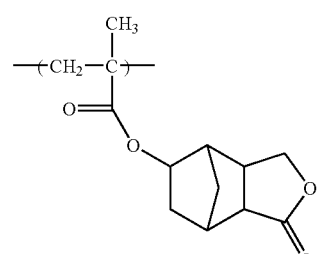
(a2-3-2)
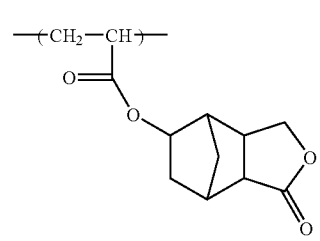
-continued
(a2-3-3)
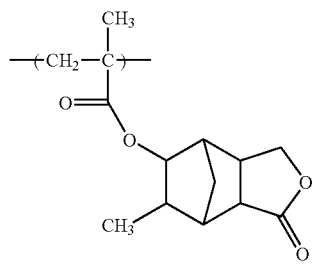
(a2-3-4)
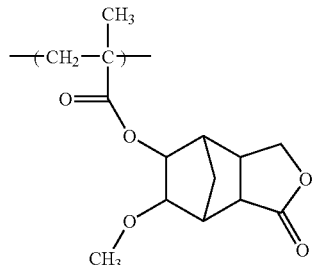
(a2-3-5)
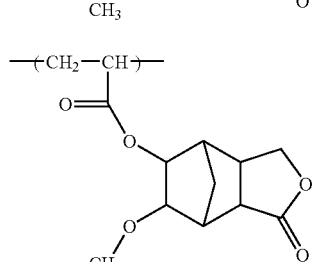
(a2-3-6)
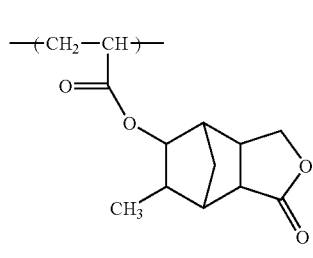
(a2-3-7)
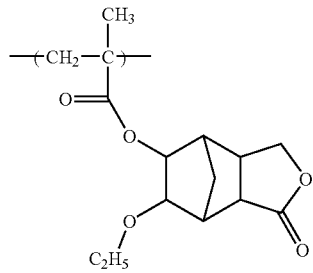
(a2-3-8)
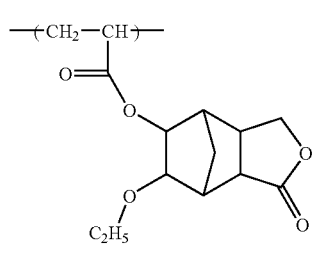

-continued
(a2-3-9)
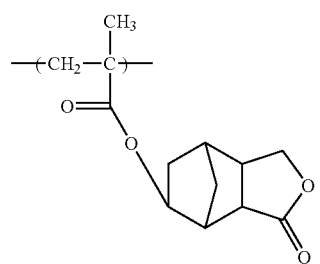
(a2-3-10)
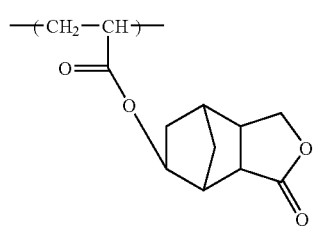
[Chemical Formula 16]
(a2-4-1)
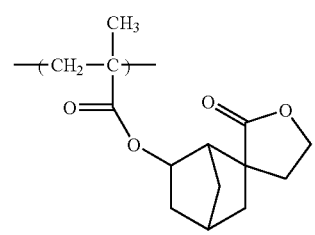
(a2-4-2)
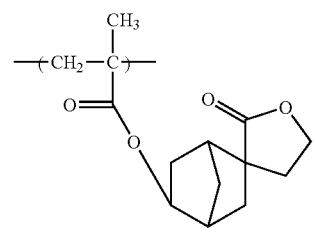
(a2-4-3)
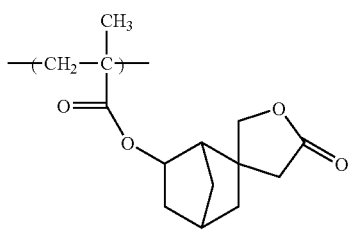
(a2-4-4)
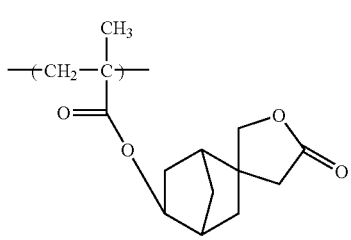
-continued
(a2-4-5)
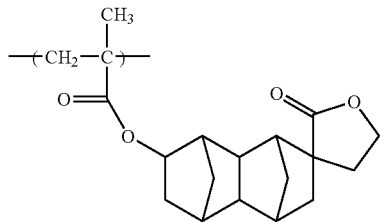
(a2-4-6)
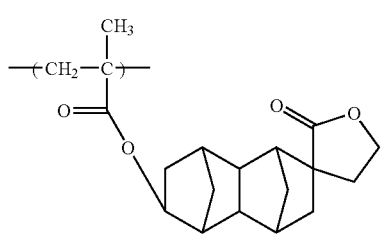
(a2-4-7)
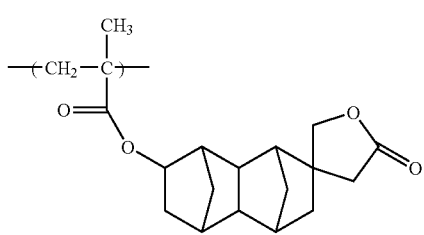
(a2-4-8)
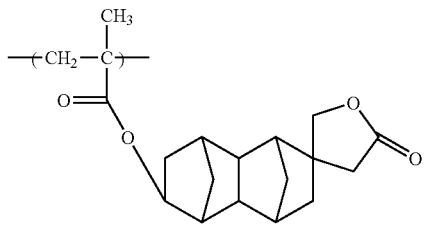
(a2-4-9)
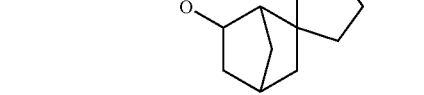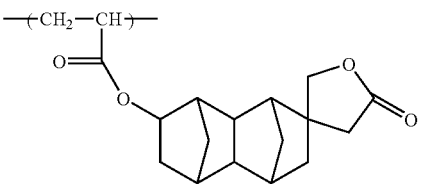
(a2-4-10)
(a4-2-11)
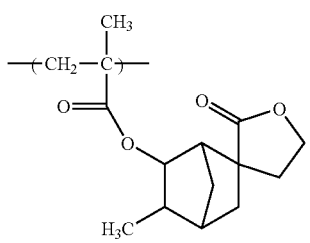

-continued (a2-4-12)
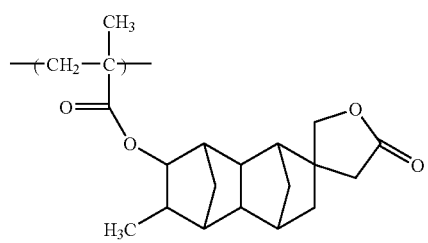

[Chemical Formula 17]

(a2-5-1)
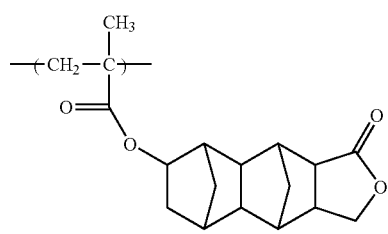

(a2-5-2)
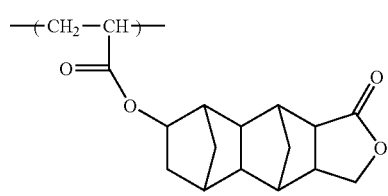

(a2-5-3)
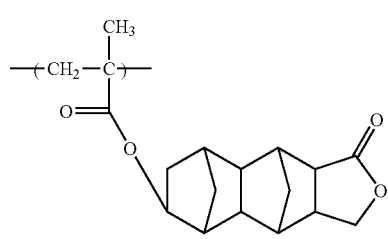

(a2-5-4)
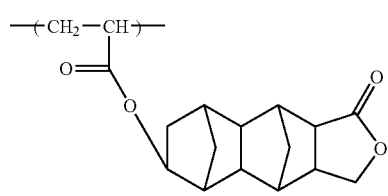

(a2-5-5)
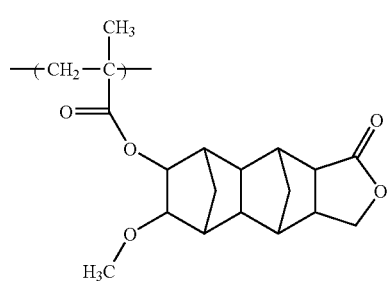

-continued (a2-5-6)
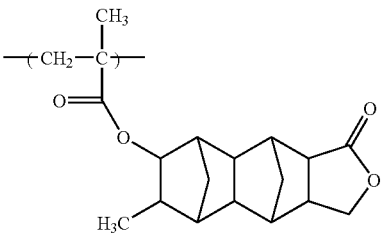

In the structural units represented by general formulas (a2-1) to (a2-5), in consideration of industrial availability, R' is preferably a hydrogen atom.

Among these, it is preferable to use at least one structural unit selected from the group consisting of formulas (a2-1) to (a2-5), and it is more preferable to use at least one structural unit selected from the group consisting of formulas (a2-1) to (a2-3). Specifically, it is preferable to use at least one structural unit selected from the group consisting of formulas (a2-1-1), (a2-1-2), (a2-2-1), (a2-2-2), (a2-3-1), (a2-3-2), (a2-3-9) and (a2-3-10).

In the component (A), as the structural unit (a2), one type of structural unit may be used, or two or more types may be used in combination.

When the component (A) contains the structural unit (a2), the amount of the structural unit (a2) based on the combined total of all structural units constituting the component (A) is preferably 5 to 60 mol %, more preferably 10 to 50 mol %, still more preferably 20 to 50 mol %. By making the amount of the structural unit (a2) at least as large as the lower limit of the above-mentioned range, the effect of using the structural unit (a2), that is, the effect of the present invention of providing a positive resist composition and method of forming a resist pattern which enable formation of a resist pattern having excellent shape with reduced LWR, can be satisfactorily achieved. On the other hand, by making the amount of the structural unit (a2) no more than the upper limit of the above-mentioned range, a good balance can be achieved with the other structural units.

Structural Unit (a3)

The component (A) preferably has a structural unit (a3) derived from an acrylate ester having a polar group-containing aliphatic hydrocarbon group, as well as the structural unit (a1).

By including the structural unit (a3), the hydrophilicity of the component (A) is improved, and hence, the affinity of the component (A) to the developing solution is improved. As a result, the alkali solubility of the exposed portions improves, which contributes to favorable improvements in the resolution.

Examples of the polar group include a hydroxyl group, a cyano group, a carboxy group, and a hydroxyalkyl group in which some of the hydrogen atoms of the alkyl group have been substituted with fluorine atoms, and a hydroxyl group is particularly desirable.

Examples of the aliphatic hydrocarbon group include linear or branched hydrocarbon groups (preferably alkylene groups) of 1 to 10 carbon atoms, and polycyclic aliphatic hydrocarbon groups (polycyclic groups). The polycyclic groups can be appropriately selected from various groups which have been proposed for the resins of resist compositions designed for use with ArF excimer lasers.

Among these, structural units derived from an acrylate ester which has an aliphatic polycyclic group containing a hydroxyl group, a cyano group, a carboxy group, or a hydroxyalkyl group in which some of the hydrogen atoms of the alkyl group have been substituted with fluorine atoms are preferable. Examples of suitable polycyclic groups include groups in which one or more hydrogen atoms have been removed from a bicycloalkane, tricycloalkane or tetracycloalkane or the like. Specific examples include groups in which one or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane, or tetracyclododecane is preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2), and (a3-3) shown below are preferable.

[Chemical Formula 18]

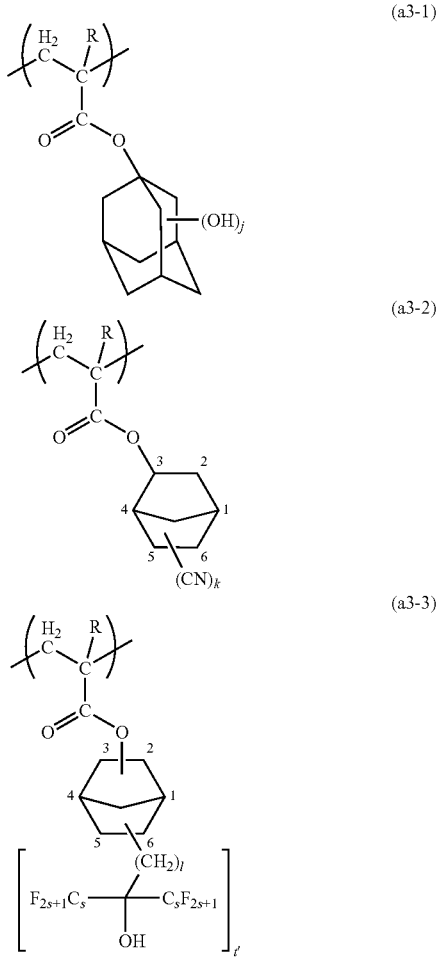

wherein R is as defined above; j is an integer of 1 to 3; k is an integer of 1 to 3; t' is an integer of 1 to 3; l is an integer of 1 to 5; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is particularly desirable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbonyl group.

In formula (a3-3), t' is preferably 1, l is preferably 1 and s is preferably 1. Further, in formula (a3-3), it is preferable that a 2-norbonyl group or 3-norbonyl group be bonded to the terminal of the carboxy group of the acrylic acid. The fluorinated alkyl alcohol is preferably bonded to the 5th or 6th position of the norbonyl group.

As the structural unit (a3), one type of structural unit may be used, or two or more types may be used in combination.

When the component (A) contains the structural unit (a3), the amount of structural unit (a3) based on the combined total of all structural units constituting the component (A) is preferably 5 to 50 mol %, more preferably 5 to 40 mol %, and still more preferably 5 to 25 mol %.

Structural Unit (a4)

The component (A) may further contain a structural unit (a4) which is other than the above-mentioned structural units (a1), (a2) and (a3), as long as the effects of the present invention of providing a positive resist composition and method of forming a resist pattern which enable formation of a resist pattern having excellent shape with reduced LWR are not impaired.

As the structural unit (a4), any other structural unit which cannot be classified as one of the above structural units (a1) to (a3) can be used without any particular limitations, and any of the multitude of conventional structural units used within resist resins for ArF excimer lasers or KrF excimer lasers (and particularly for ArF excimer lasers) can be used.

As the structural unit (a4), a structural unit which contains a non-acid-dissociable aliphatic polycyclic group, and is also derived from an acrylate ester is preferable. Examples of this polycyclic group include the same groups as those described above in relation to the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecanyl group, adamantyl group, tetracyclododecanyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (a-4-1) to (a-4-5) shown below.

[Chemical Formula 19]

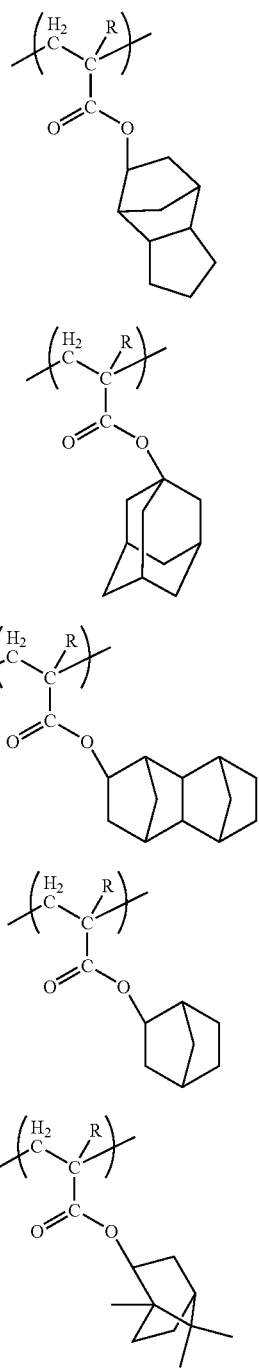

(a4-1)

(a4-2)

(a4-3)

(a4-4)

(a4-5)

wherein R is as defined above.

When the structural unit (a4) is included in the component (A), the amount of the structural unit (a4) based on the combined total of all the structural units that constitute the component (A) is typically within a range from 1 to 30 mol %, and preferably from 10 to 20 mol %.

In the present invention, the component (A) is a resin component including at least the structural unit (a1), prefer- ably further including the structural unit (a2) and/or (a3), and more preferably further including the structural unit (a2) and (a3).

Further, it is preferable that the component (A) contains a copolymer including at least the structural unit (a1). Examples of such a copolymer include a copolymer consisting of the structural units (a1) and (a2) and/or (a3), and a copolymer consisting of the structural units (a1) and (a2) and/or (a3), and (a4). A copolymer consisting of structural units (a1), (a2) and (a3) is particularly desirable. In the component (A), one type of copolymer may be used, or two or more types may be used in combination. As the copolymer usable in the present invention, a copolymer including a combination of structural units represented by formula (A1-11) shown below is preferable.

[Chemical Formula 20]

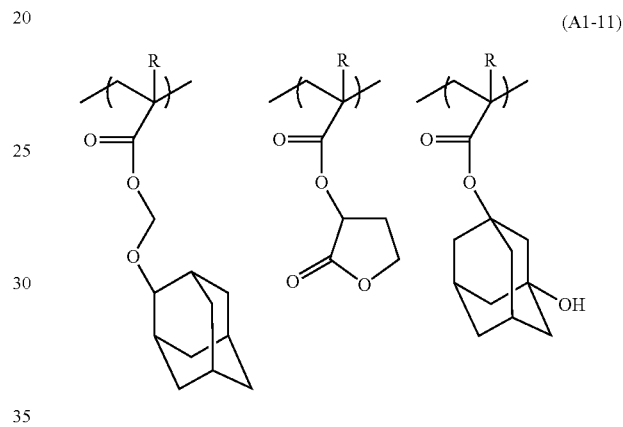

(A1-11)

wherein R is as defined above.

The component (A) can be obtained, for example, by a conventional radical polymerization or the like of the monomers corresponding with each of the structural units, using a radical polymerization initiator such as azobisisobutyronitrile (AIBN).

Furthermore, in the component (A), by using a chain transfer agent such as HS—CH$_2$—CH$_2$—CH$_2$—C(CF$_3$)$_2$—OH, a —C(CF$_3$)$_2$—OH group can be introduced at the terminals of the component (A). Such a component (A) having introduced a hydroxyalkyl group in which some of the hydrogen atoms of the alkyl group are substituted with fluorine atoms is effective in decreasing developing defects and LER (line edge roughness: unevenness of the side walls of a line pattern).

The weight average molecular weight (Mw) (the polystyrene equivalent value determined by gel permeation chromatography) of the component (A) is not particularly limited, but is preferably 2,000 to 50,000, more preferably 3,000 to 30,000, and most preferably 5,000 to 20,000. By making the weight average molecular weight no more than the upper limit of the above-mentioned range, the component (A) exhibits satisfactory solubility in a resist solvent when used as a resist. On the other hand, by making the weight average molecular weight at least as large as the lower limit of the above-mentioned range, dry etching resistance and cross-sectional shape of the resist pattern becomes satisfactory.

Further, the dispersity (Mw/Mn) is preferably 1.0 to 5.0, more preferably 1.0 to 3.0, and most preferably 1.2 to 2.5. Here, Mn is the number average molecular weight.

<Component (B)>

In the present invention, as the component (B), an acid generator (B1) having a cation moiety represented by general formula (b-5) shown above is used as an essential component.

In general formula (b-5), $R^a$ and $R^b$ each independently represents an alkyl group, an alkoxy group, a halogen atom or a hydroxyl group. n' and n" each independently represents an integer of 0 to 3. When n' and n" are 2 or 3, the plurality of $R^a$ and $R^b$ may be the same or different.

As the alkyl group for $R^a$ and $R^b$, a linear or branched alkyl group is preferable, and an alkyl group of 1 to 5 carbon atoms is preferable, and a methyl group, an ethyl group, a propyl group, an n-butyl group or a tert-butyl group is more preferable.

As the alkoxy group for $R^a$ and $R^b$, an alkoxy group of 1 to 5 carbon atoms is preferable, and a methoxy group or an ethoxy group is more preferable.

As the halogen atom for $R^a$ and $R^b$, a fluorine atom is preferable.

n' and n" are preferably 0 or 1, and more preferably 0. It is particularly desirable that both of n' and n" be 0.

In general formula (b-5), $R^c$ represents an aryl group or alkyl group which may or may not have a substituent.

As the aryl group for $R^c$, there is no particular limitation, and examples include aryl groups of 6 to 20 carbon atoms which may or may not have some of the hydrogen atoms substituted with alkyl groups, alkoxy groups, halogen atoms or hydroxyl groups. As the aryl group, an aryl group of 6 to 10 carbon atoms is preferable as it can be synthesized at a low cost. Specific examples include a phenyl group and a naphthyl group.

When the aryl group has some of the hydrogen atoms substituted, the alkyl group for the substituent is the same as the alkyl group for $R^a$ and $R^b$.

When the aryl group has some of the hydrogen atoms substituted, the alkoxy group for the substituent is the same as the alkoxy group for $R^a$ and $R^b$.

When the aryl group has some of the hydrogen atoms substituted, the halogen atom for the substituent is the same as the halogen atom for $R^a$ and $R^b$.

As the alkyl group for $R^c$, there is no particular limitation. For example, linear, branched or cyclic alkyl groups of 1 to 10 carbon atoms can be mentioned. In consideration of achieving excellent resolution, it is preferable to use alkyl groups of 1 to 5 carbon atoms. Specific examples include a methyl group, an ethyl group, an n-propyl group, an isopropyl group, an n-butyl group, an isobutyl group, an n-pentyl group, a cyclopentyl group, a hexyl group, a cyclohexyl group, a nonyl group and a decanyl group. Of these, a methyl group is particularly desirable, as it offers an excellent resolution, and can be synthesized at a low cost.

It is particularly desirable that $R^c$ be a phenyl group.

As the anion moiety of the component (B1), there is no particular limitation, and any anion moiety can be appropriately used which is known as an anion moiety of an onium salt-based acid generator.

For example, an anion moiety represented by general formula: $R^{14} SO_3^-$ (wherein $R^{14}$ represents a linear, branched or cyclic alkyl group or fluorinated alkyl group), an anion moiety represented by general formula (b-3) shown below, or an anion moiety represented by general formula (b-4) shown below can be used.

[Chemical Formula 21]

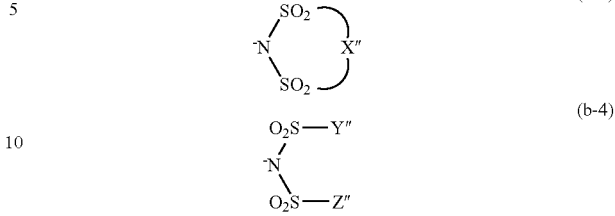

wherein X" represents an alkylene group of 2 to 6 carbon atoms in which at least one hydrogen atom has been substituted with a fluorine atom; and Y" and Z" each independently represents an alkyl group of 1 to 10 carbon atoms in which at least one hydrogen atom has been substituted with a fluorine atom.

In general formula: $R^{14}SO_3^-$, $R^{14}$ represents a linear, branched or cyclic alkyl group or fluorinated alkyl group.

The linear or branched alkyl group for $R^{14}$ preferably has 1 to 10 carbon atoms, more preferably 1 to 8 carbon atoms, and most preferably 1 to 4 carbon atoms.

The cyclic alkyl group for $R^{14}$ preferably has 4 to 15 carbon atoms, more preferably 4 to 10 carbon atoms, and most preferably 6 to 10 carbon atoms.

The fluorinated alkyl group for $R^{14}$ preferably has 1 to 10 carbon atoms, more preferably 1 to 8 carbon atoms, and most preferably 1 to 4 carbon atoms. The fluorination ratio of the fluorinated alkyl group (percentage of fluorine atoms substituting the hydrogen atoms within the alkyl group, based on the total number of hydrogen atoms within the alkyl group prior to fluorination, and the same applies to the fluorination ratio described below) is preferably from 10 to 100%, more preferably from 50 to 100%, and it is particularly desirable that all of the hydrogen atoms are substituted with fluorine atoms, as the acid strength increases.

$R^{14}$ is most preferably a linear or cyclic alkyl group or fluorinated alkyl group.

In general formula (b-3) above, X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

In general formula (b-4) above, Y" and Z" each independently represents a linear or branched alkyl group in which at least one hydrogen atom has been substituted with a fluorine atom, and the alkyl group preferably has 1 to 10 carbon atoms, more preferably 1 to 7 carbon atoms, and most preferably 1 to 3 carbon atoms.

The smaller the number of carbon atoms of the alkylene group of X" or those of the alkyl group of Y" and Z" within the above-mentioned range of the number of carbon atoms, the more the solubility in a resist solvent is improved.

Further, in the alkylene group of X" or the alkyl group of Y" and Z", it is preferable that the number of hydrogen atoms substituted with a fluorine atom is as large as possible, as the acid strength increases, and the transparency to high energy radiation of 200 nm or less or electron beam is improved. The fluorination ratio the alkylene group or alkyl group is preferably from 70 to 100%, more preferably from 90 to 100%, and it is particularly desirable that the alkylene group or alkyl group be a perfluoroalkylene or perfluoroalkyl group in which all hydrogen atoms are substituted with fluorine atoms.

As the anion moiety of the component (B1), an anion moiety represented by general formula: $R^{14}SO_3^-$ is preferable, and those in which $R^{14}$ represents a fluorinated alkyl group are more preferable.

Preferred examples of the component (B1) are shown below.

[Chemical Formula 22]

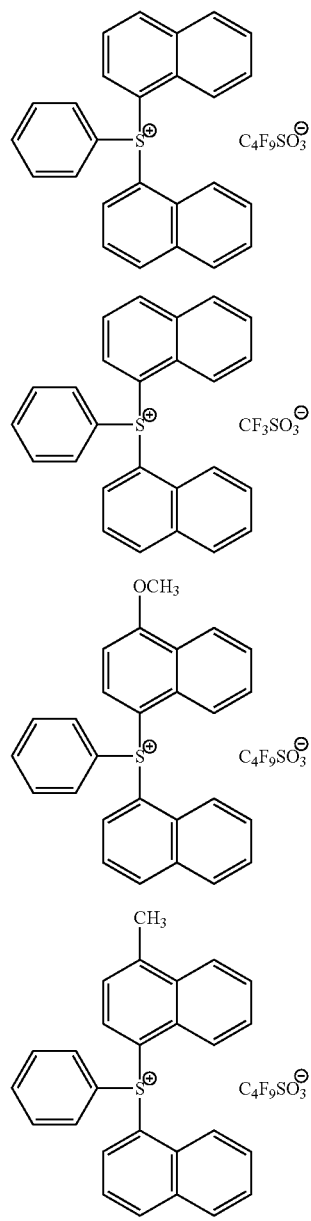

(b5-01)

(b5-02)

(b5-03)

(b5-04)

Among these, at least one acid generator selected from the group consisting of the chemical formulas (b5-01) to (b5-04) is particularly desirable.

As the component (B1), one type of acid generator may be used, or two or more types may be used in combination.

The amount of the component (B1) within the component (B) is preferably 40% by weight or more, more preferably 70% by weight or more, and may be even 100% by weight. It is particularly desirable that the amount of the component (B1) within the component (B) be 100% by weight.

As the component (B), an acid generator (B2) (hereafter, referred to as "component (B2)") which is other than the aforementioned component (B1) may be used in combination with the component (B1).

As the component (B2), there is no particular limitation as long as it is an acid generator other than the component (B1), and any of the known acid generators used in conventional chemically amplified resist compositions can be used.

Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

Examples of onium salt-based acid generators include compounds represented by general formula (b-0) shown below.

[Chemical Formula 23]

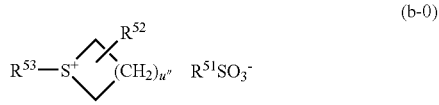

(b-0)

wherein $R^{51}$ represents a linear, branched or cyclic alkyl group, or a linear, branched or cyclic fluorinated alkyl group; $R^{52}$ represents a hydrogen atom, a hydroxyl group, a halogen atom, a linear or branched alkyl group, a linear or branched halogenated alkyl group, or a linear or branched alkoxy group; $R^{53}$ represents an aryl group which may have a substituent; and u" represents an integer of 1 to 3.

In general formula (b-0), $R^{51}$ represents a linear, branched or cyclic alkyl group, or a linear, branched or cyclic fluorinated alkyl group.

The linear or branched alkyl group preferably has 1 to 10 carbon atoms, more preferably 1 to 8 carbon atoms, and most preferably 1 to 4 carbon atoms.

The cyclic alkyl group preferably has 4 to 12 carbon atoms, more preferably 5 to 10 carbon atoms, and most preferably 6 to 10 carbon atoms.

The linear or branched fluorinated alkyl group preferably has 1 to 10 carbon atoms, more preferably 1 to 8 carbon atoms, and most preferably 1 to 4 carbon atoms.

The cyclic fluorinated alkyl group preferably has 4 to 12 carbon atoms, more preferably 5 to 10 carbon atoms, and most preferably 6 to 10 carbon atoms.

The fluorination ratio of the fluorinated alkyl group (percentage of fluorine atoms substituting the hydrogen atoms within the alkyl group, based on the total number of hydrogen atoms within the alkyl group prior to fluorination) is preferably from 10 to 100%, more preferably from 50 to 100%, and it is particularly desirable that all of the hydrogen atoms are substituted with fluorine atoms, as the acid strength increases.

$R^{51}$ is most preferably a linear or cyclic alkyl group or fluorinated alkyl group.

$R^{52}$ represents a hydrogen atom, a hydroxyl group, a halogen atom, a linear or branched alkyl group, a linear or branched halogenated alkyl group, or a linear or branched alkoxy group.

Examples of the halogen atom for $R^{52}$ include a fluorine atom, a bromine atom, a chlorine atom and an iodine atom, and a fluorine atom is preferable.

The alkyl group for $R^{52}$ is linear or branched, and preferably has 1 to 5 carbon atoms, more preferably 1 to 4 carbon atoms, and most preferably 1 to 3 carbon atoms.

The halogenated alkyl group for $R^{52}$ is a group in which some or all of the hydrogen atoms of the alkyl group have been substituted with halogen atoms. As the alkyl group of the halogenated alkyl group, the same as the alkyl group for $R^{52}$ may be exemplified. As the halogen atoms for substituting the hydrogen atoms of the alkyl group, the same as the halogen atom for $R^{52}$ may be exemplified. In the halogenated alkyl group, it is preferable that 50 to 100% of the hydrogen atoms of the alkyl group be substituted with halogen atoms, and it is more preferable that all of the hydrogen atoms are substituted with halogen atoms.

The alkoxy group for $R^{52}$ is linear or branched, and preferably has 1 to 5 carbon atoms, more preferably 1 to 4 carbon atoms, and most preferably 1 to 3 carbon atoms.

Among these, as $R^{52}$, a hydrogen atom is particularly desirable.

$R^{53}$ represents an aryl group which may have a substituent, and examples of the basic ring excluding the substituent include a naphthyl group, a phenyl group and an anthracenyl group. In terms of the effects of the present invention and absorption of exposure ray such as ArF excimer laser, a phenyl group is preferable.

Examples of the substituent include a hydroxyl group and a lower alkyl group (linear or branched, and preferably has no more than 5 carbon atoms, and a methyl group is particularly desirable).

As the aryl group for $R^{53}$, those which do not have a substituent are preferable.

u" is an integer of 1 to 3, preferably 2 or 3, and it is particularly desirable that u" be 3.

As preferred examples of acid generators represented by general formula (b-0), the following can be exemplified.

[Chemical Formula 24]

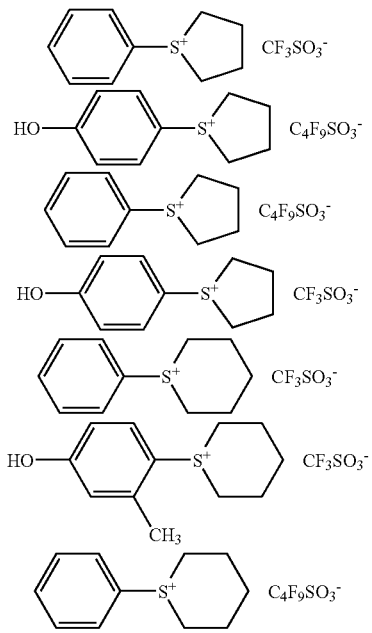

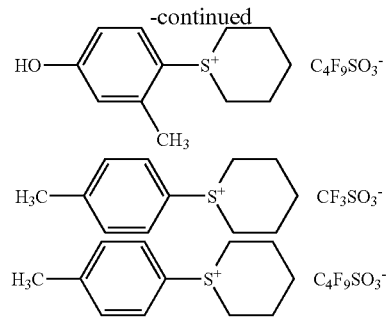

As the acid generator represented by general formula (b-0), one type of acid generator may be used, or two or more types may be used in combination.

Further, as onium salt-based acid generators other than acid generators represented by general formula (b-0), compounds represented by general formula (b-1) or (b-2) shown below may be used.

[Chemical Formula 25]

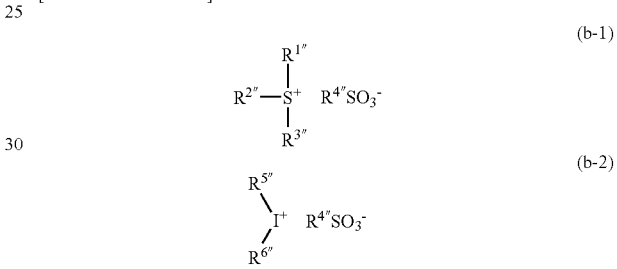

wherein $R^{1''}$ to $R^{3''}$, $R^{5''}$ and $R^{6''}$, each independently represents an aryl group (excluding the case where two or more of $R^{1''}$ to $R^{3''}$ represent naphthyl groups which may be substituted with an alkyl group, an alkoxy group, a halogen atom or a hydroxyl group) or alkyl group; and $R^{4''}$ represents a linear, branched or cyclic alkyl group or fluorinated alkyl group, with the proviso that at least one of $R^{1''}$ to $R^{3''}$ represents an aryl group, and at least one of $R^{5''}$ and $R^{6''}$ represents an aryl group.

In formula (b-1), $R^{1''}$ to $R^{3''}$ each independently represents an aryl group (excluding the case where two or more of $R^{1''}$ to $R^{3''}$ represent naphthyl groups which may be substituted with an alkyl group, an alkoxy group, a halogen atom or a hydroxyl group) or an alkyl group.

Among $R^{1''}$ to $R^{3''}$, at least one group represents an aryl group. Among $R^{1''}$ to $R^{3''}$, two or more groups are preferably aryl groups, and it is particularly desirable that all of $R^{1''}$ to $R^{3''}$ are aryl groups. However, the case where two or more of $R^{1''}$ to $R^{3''}$ represent naphthyl groups which may be substituted with an alkyl group, an alkoxy group, a halogen atom or a hydroxyl group is excluded.

The aryl group for $R^{1''}$ to $R^{3''}$ is not specifically limited. For example, an aryl group having 6 to 20 carbon atoms may be used in which some or all of the hydrogen atoms of the aryl group may or may not be substituted with alkyl groups, alkoxy groups or halogen atoms. The aryl group is preferably an aryl group having 6 to 10 carbon atoms because it can be synthesized at a low cost. Specific examples thereof include a phenyl group and a naphthyl group.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, and most preferably a methoxy group or an ethoxy group.

The halogen atom, with which hydrogen atoms of the aryl group may be substituted, is preferably a fluorine atom.

The alkyl group for $R^{1\prime\prime\prime}$ to $R^{3\prime\prime\prime}$ is not specifically limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, and a methyl group is most preferable because it is excellent in resolution and can be synthesized at a low cost.

It is particularly desirable that all of $R^{1\prime\prime\prime}$ to $R^{3\prime\prime\prime}$ are phenyl groups.

$R^{4\prime\prime\prime}$ represents a linear, branched or cyclic alkyl group or fluorinated alkyl group.

The linear or branched alkyl group preferably has 1 to 10 carbon atoms, more preferably 1 to 8 carbon atoms, and most preferably 1 to 4 carbon atoms.

The cyclic alkyl group is preferably a cyclic group, as described for $R^{1\prime\prime\prime}$, having 4 to 15 carbon atoms, more preferably 4 to 10 carbon atoms, and most preferably 6 to 10 carbon atoms.

The fluorinated alkyl group preferably has 1 to 10 carbon atoms, more preferably 1 to 8 carbon atoms, and most preferably 1 to 4 carbon atoms.

Further, the fluorination ratio of the fluorinated alkyl group (ratio of fluorine atoms within the alkyl group) is preferably from 10 to 100%, more preferably from 50 to 100%, and it is particularly desirable that all of the hydrogen atoms are substituted with fluorine atoms because the acid strength increases.

$R^{4\prime\prime\prime}$ is most preferably a linear or cyclic alkyl group or fluorinated alkyl group.

In formula (b-2), $R^{5\prime\prime\prime}$ and $R^{6\prime\prime\prime}$ each independently represents an aryl group or alkyl group. At least one of $R^{5\prime\prime\prime}$ and $R^{6\prime\prime\prime}$ represents an aryl group. It is preferable that both of $R^{5\prime\prime\prime}$ and $R^{6\prime\prime\prime}$ represents an aryl group.

As the aryl group for $R^{5\prime\prime\prime}$ and $R^{6\prime\prime\prime}$, the same as the aryl groups for $R^{1\prime\prime\prime}$ to $R^{3\prime\prime\prime}$ can be exemplified.

As the alkyl group for $R^{5\prime\prime\prime}$ and $R^{6\prime\prime\prime}$, the same as the alkyl groups for $R^{1\prime\prime\prime}$ to $R^{3\prime\prime\prime}$ can be exemplified.

It is particularly desirable that both of $R^{5\prime\prime\prime}$ and $R^{6\prime\prime\prime}$ represents a phenyl group.

As $R^{4\prime\prime\prime}$ in formula (b-2), the same as those mentioned above for $R^{4\prime\prime\prime}$ in formula (b-1) can be exemplified.

Specific examples of suitable onium salt-based acid generators include diphenyliodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, (4-methylphenyl)diphenylsulfonium trifluoromethanesulfonate, heptafluoropropanesulfonate or nonafluorobutanesulfonate, (4-methoxyphenyl-diphenylsulfonium trifluoromethanesulfonate, heptafluoropropanesulfonate or nonafluorobutanesulfonate, tri(4-tert-butyl)phenylsulfonium trifluoromethanesulfonate, heptafluoropropanesulfonate or nonafluorobutanesulfonate, and diphenyl(1-(4-methoxy)naphthyl)sulfonium trifluoromethanesulfonate, heptafluoropropanesulfonate or nonafluorobutanesulfonate. It is also possible to use onium salts in which the anion moiety of these onium salts are replaced by methanesulfonate, n-propanesulfonate, n-butanesulfonate, or n-octanesulfonate.

Further, acid generators in which the anion moiety in general formula (b-1) or (b-2) is replaced with an anion moiety represented by general formula (b-3) or (b-4) shown above (the cation moiety is the same as (b-1) or (b-2)) may be used.

In the present description, an oximesulfonate-based acid generator is a compound having at least one group represented by general formula (B-1) shown below, and has a feature of generating acid by irradiation. Such oximesulfonate-based acid generators are widely used for a chemically amplified resist composition, and can be appropriately selected.

[Chemical Formula 26]

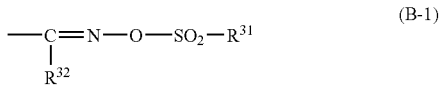

wherein $R^{31}$ and $R^{32}$ each independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The expression "having a substituent" means that some or all of the hydrogen atoms of the alkyl group or the aryl group are replaced with substituents.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, partially or completely halogenated alkyl group (hereinafter, sometimes referred to as a "halogenated alkyl group") is particularly desirable. The "partially halogenated alkyl group" refers to an alkyl group in which some of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms, and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ are the same as those of the alkyl group and the aryl group for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate-based acid generator include compounds represented by general formula (B-2) or (B-3) shown below.

[Chemical Formula 27]

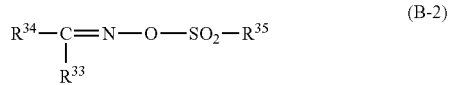

(B-2)

wherein $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 28]

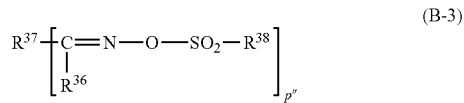

(B-3)

wherein $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As for the $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and still more preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthracyl group, and a phenantryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, and alkoxy group. The alkyl group, halogenated alkyl group and alkoxyalkyl group as the substituent preferably has 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), the alkyl group having no substituent and the halogenated alkyl group for $R^{36}$ are the same as the alkyl group having no substituent and the halogenated alkyl group for $R^{33}$.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate-based acid generators include
α-(p-toluenesulfonyloxyimino)-benzyl cyanide,
α-(p-chlorobenzenesulfonyloxyimino)-benzyl cyanide,
α-(4-nitrobenzenesulfonyloxyimino)-benzyl cyanide,
α-(4-nitro-2-trifluoromethylbenzenesulfonyloxyimino)-benzyl cyanide,
α-(benzenesulfonyloxyimino)-4-chlorobenzyl cyanide,
α-(benzenesulfonyloxyimino)-2,4-dichlorobenzyl cyanide,
α-(benzenesulfonyloxyimino)-2,6-dichlorobenzyl cyanide,
α-(benzenesulfonyloxyimino)-4-methoxybenzyl cyanide,
α-(2-chlorobenzenesulfonyloxyimino)-4-methoxybenzyl cyanide,
α-(benzenesulfonyloxyimino)-thien-2-yl acetonitrile,
α-(4-dodecylbenzenesulfonyloxyimino)benzyl cyanide,
α-[(p-toluenesulfonyloxyimino)-4-methoxyphenyl]acetonitrile,
α-[(dodecylbenzenesulfonyloxyimino)-4-methoxyphenyl] acetonitrile,
α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile,
α-(methylsulfonyloxyimino)-1-cycloheptenyl acetonitrile,
α-(methylsulfonyloxyimino)-1-cyclooctenyl acetonitrile,
α-(trifluoromethylsulfonyloxyimino)-1-cyclopentenyl acetonitrile,
α-(trifluoromethylsulfonyloxyimino)-cyclohexyl acetonitrile,
α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile,
α-(cyclohexylsulfonyloxyimino)-cyclohexyl acetonitrile,
α-(cyclohexylsulfonyloxyimino)-1-cyclopentenyl acetonitrile,
α-(ethylsulfonyloxyimino)-1-cyclopentenyl acetonitrile,
α-(isopropylsulfonyloxyimino)-1-cyclopentenyl acetonitrile, α-(n-butylsulfonyloxyimino)-1-cyclopentenyl acetonitrile,
α-(ethylsulfonyloxyimino)-1-cyclohexenyl acetonitrile,
α-(isopropylsulfonyloxyimino)-1-cyclohexenyl acetonitrile,
α-(n-butylsulfonyloxyimino)-1-cyclohexenyl acetonitrile,
α-(methylsulfonyloxyimino)-phenyl acetonitrile,
α-(methylsulfonyloxyimino)-p-methoxyphenyl acetonitrile,
α-(trifluoromethylsulfonyloxyimino)-phenyl acetonitrile,
α-(trifluoromethylsulfonyloxyimino)-p-methoxyphenyl acetonitrile,
α-(ethylsulfonyloxyimino)-p-methoxyphenyl acetonitrile,
α-(propylsulfonyloxyimino)-p-methylphenyl acetonitrile, and
α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described at pages 65 to 85) may be preferably used.

Furthermore, as preferable examples, the following can be exemplified.

[Chemical Formula 29]

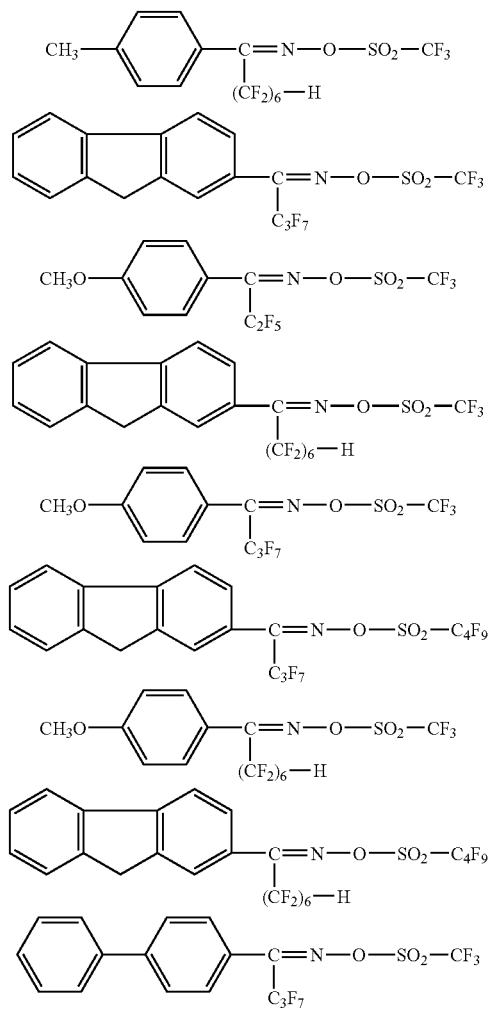

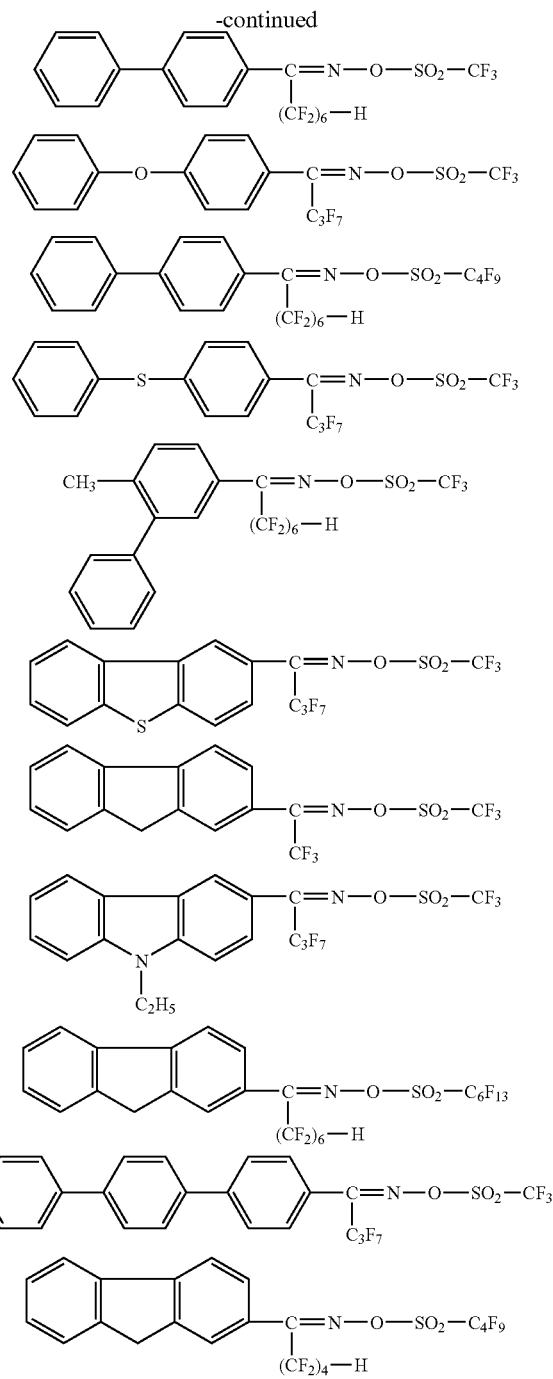

Among the above-exemplified compounds, the following 4 compounds are preferable.

[Chemical Formula 30]

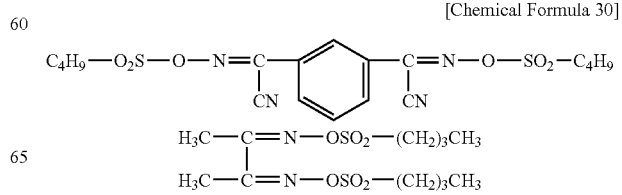

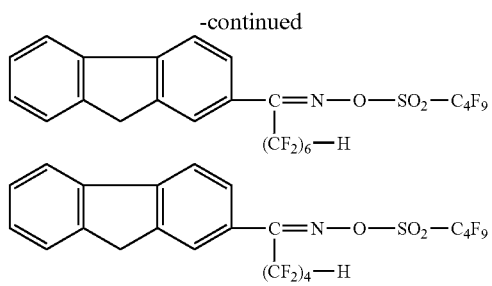

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as poly(bis-sulfonyl)diazomethanes, those disclosed in Japanese Unexamined Patent Application, First Publication No. Hei 11-322707, including
1,3-bis(phenylsulfonyldiazomethylsulfonyl)propane,
1,4-bis(phenylsulfonyldiazomethylsulfonyl)butane,
1,6-bis(phenylsulfonyldiazomethylsulfonyl)hexane,
1,10-bis(phenylsulfonyldiazomethylsulfonyl)decane,
1,2-bis(cyclohexylsulfonyldiazomethylsulfonyl)ethane,
1,3-bis(cyclohexylsulfonyldiazomethylsulfonyl)propane,
1,6-bis(cyclohexylsulfonyldiazomethylsulfonyl)hexane, and
1,10-bis(cyclohexylsulfonyldiazomethylsulfonyl)decane,
may be exemplified.

As the component (B2), one type of acid generator may be used, or two or more types may be used in combination.

The total amount of the component (B) within the positive resist composition of the present invention is 0.5 to 30 parts by weight, and preferably 1 to 10 parts by weight, relative to 100 parts by weight of the component (A). When the amount of the component (B) is within the above-mentioned range, formation of a resist pattern can be satisfactorily performed. Further, by virtue of the above-mentioned range, a uniform solution can be obtained and the storage stability becomes satisfactory.

<Component (D)>

In the positive resist composition of the present invention, for improving the resist pattern shape and the post exposure stability of the latent image formed by the pattern-wise exposure of the resist layer, it is preferable to add a nitrogen-containing organic compound (D) (hereafter referred to as the component (D)) as an optional component.

A multitude of these components (D) have already been proposed, and any of these known compounds may be used, although an aliphatic amine, and particularly a secondary aliphatic amine or tertiary aliphatic amine is preferable.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkyl alcohol amines). Specific examples of these aliphatic amines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n-octanolamine.

Among these, alkyl alcohol amines and trialkyl amines are preferable, and alkyl alcohol amines are particularly desirable. Among alkyl alcohol amines, triethanolamine and tri-isopropanolamine are particularly desirable.

These compounds can be used either alone, or in combinations of two or more different compounds.

The component (D) is typically used in an amount within a range from 0.01 to 5.0 parts by weight, relative to 100 parts by weight of the component (A).

<Optional Components>

Furthermore, in the positive resist composition of the present invention, for preventing any deterioration in sensitivity, and improving the resist pattern shape and the post exposure stability of the latent image formed by the pattern-wise exposure of the resist layer, an organic carboxylic acid, or a phosphorus oxo acid or derivative thereof (E) (hereafter referred to as the component (E)) can also be added as an optional component.

Examples of preferable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly desirable.

The component (E) is typically used in an amount within a range from 0.01 to 5.0 parts by weight, relative to 100 parts by weight of the component (A).

If desired, other miscible additives can also be added to the positive resist composition of the present invention. Examples of such miscible additives include additive resins for improving the performance of the resist film, surfactants for improving the applicability, dissolution inhibitors, plasticizers, stabilizers, colorants, halation prevention agents, and dyes.

The positive resist composition of the present invention can be prepared by dissolving the materials for the resist composition in an organic solvent (hereafter, frequently referred to as "component (S)").

The component (S) may be any organic solvent which can dissolve the respective components to give a uniform solution, and any one or more kinds of organic solvents can be appropriately selected from those which have been conventionally known as solvents for a chemically amplified resist.

Examples thereof include lactones such as γ-butyrolactone; ketones such as acetone, methyl ethyl ketone, cyclohexanone, methyl isoamyl ketone, and 2-heptanone; polyhydric alcohols and derivatives thereof, such as ethylene glycol, diethylene glycol, propylene glycol and dipropylene glycol; compounds having an ether bond, such as ethylene glycol monoacetate, diethylene glycol monoacetate, propylene glycol monoacetate, and dipropylene glycol monoacetate;

monomethylether, monoethylether, monopropylether, monobutylether or monophenylether of any of these polyhydric alcohols or compounds having an ether bond; cyclic ethers such as dioxane; and esters such as methyl lactate, ethyl lactate (EL), methyl acetate, ethyl acetate, butyl acetate, methyl pyruvate, ethyl pyruvate, methyl methoxypropionate, and ethyl ethoxypropionate.

These solvents can be used individually, or in combination as a mixed solvent.

Among these, propylene glycol monomethyl ether acetate (PGMEA), propylene glycol monomethyl ether (PGME) and EL are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably from 1:9 to 9:1, more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3.

Further, as the (S) component, a mixed solvent of at least one of PGMEA and EL with γ-butyrolactone is also preferable. The mixing ratio (former:latter) of such a mixed solvent is preferably from 70:30 to 95:5.

The amount of the organic solvent is not particularly limited, and is appropriately adjusted to a concentration which enables coating of a coating solution to a substrate, depending on the thickness of the coating film. In general, the organic solvent is used in an amount such that the solid content of the resist composition becomes within the range from 2 to 20% by weight, and preferably from 5 to 15% by weight.

The positive resist composition of the present invention has the effect of enabling formation of a resist pattern having excellent shape with reduced LWR. The reason for this has not yet been elucidated, but is presumed as follows.

The component (B1) which is an essential component of the positive resist composition of the present invention has two or more substituents derived from naphthalene in the cation moiety thereof. Therefore, it is presumed that by using the component (B1), absorption of light in the exposure wavelength band (especially the wavelength band of ArF excimer laser) is effectively suppressed, as compared to the case where an onium salt-based acid generator such as a triphenyl sulfonium (TPS)-based acid generator is used.

Therefore it is presumed that a large amount of the component (B1) can be added to the resist composition, and the action of the component (B1) on a unit area of the exposed portions is enhanced, and as a result, the shape of the resist pattern surface becomes excellent (smooth).

Further, by the positive resist composition of the present invention, a resist pattern having a high rectangularity on the upper portions thereof can be obtained.

Furthermore, by the positive resist composition of the present invention, effect of suppressing footing can be achieved which occurs depending on the type of substrate used. As a result, a resist pattern having an excellent shape can be obtained regardless of the type of substrate used. It is presumed that this effect is achieved by using a combination of the component (A) and the component (B) due to the fact that the structural unit (a1) has an acetal-type acid dissociable, dissolution inhibiting group which can be dissociated by a weak acid, and absorption of light is suppressed by the component (B1) so that the transparency of the resist composition is enhanced.

As the substrate, examples include typical silicon substrates and "inorganic substrates" such as a substrate having a nitrogen-containing layer. A nitrogen-containing layer is generally provided as an insulating layer, a metal layer or the like on the substrate depending on use, and contains nitrogen. Examples of insulating films include silicon nitride (SiN) and trisilicon tetranitride ($Si_3N_4$). Example of metal layer includes titanium nitride (TiN). The nitrogen-containing layer is formed, for example, on a substrate such as a silicon substrate by vapor deposition or the like. Thus, such substrates on which a layer mainly containing atoms other than silicon is formed are referred to as "inorganic substrates".

<Method of Forming a Resist Pattern>

The method of forming a resist pattern according to the present invention can be performed, for example, as follows.

Firstly, a positive resist composition according to the present invention is applied to a substrate such as a silicon wafer using a spinner or the like, and a prebake is conducted under temperature conditions of 80 to 150° C. for 40 to 120 seconds, preferably 60 to 90 seconds. Then, using an ArF exposure apparatus or the like, the resulting film is selectively exposed to an ArF excimer laser beamor the like through a desired mask pattern, followed by post exposure bake (PEB) under temperature conditions of 80 to 150° C. for 40 to 120 seconds, preferably 60 to 90 seconds.

Subsequently, developing is conducted using an alkali developing solution such as a 0.1 to 10% by weight aqueous solution of tetramethylammonium hydroxide.

In this manner, a resist pattern that is faithful to the mask pattern can be obtained.

An organic or inorganic anti-reflective film may also be provided between the substrate and the applied layer of the resist composition. Further, as a substrate, an inorganic substrate can be used.

The wavelength to be used for exposure is not particularly limited and the exposure can be conducted using radiations such as ArF excimer laser, KrF excimer laser, $F_2$ excimer laser, extreme ultraviolet rays (EUV), vacuum ultraviolet rays (VUV), electron beam (EB), X-rays, and soft X-rays. The positive resist composition of the present invention is particularly effective to ArF excimer laser.

EXAMPLES

As follows is a description of examples of the present invention, although the scope of the present invention is by no way limited by these examples.

Example 1 and Comparative Examples 1 and 2

The components indicated in Table 1 were mixed together and dissolved, thereby obtaining a positive resist composition solution.

TABLE 1

|  | (A) | (B) | (D) | (S) |
| --- | --- | --- | --- | --- |
| Example 1 | (A)-1 | (B)-1 | (D)-1 | (S)-1 |
|  | [100] | [7.5] | [0.38] | [1300] |
| Comparative Example 1 | (A)-1 | (B)-2 | (D)-1 | (S)-1 |
|  | [100] | [3.0] | [0.38] | [1300] |
| Comparative Example 2 | (A)-2 | (B)-1 | (D)-1 | (S)-1 |
|  | [100] | [7.5] | [0.38] | [1300] |

In Table 1, the reference characters indicate the following. Further, the values in brackets [ ] indicate the amount (in terms of parts by weight) of the component added.

(A)-1: Copolymer represented by formula (A)-1 shown below, wherein a1:b1:c1=4:4:2 (molar ratio), Mw=10,000, Mw/Mn=1.8

(A)-2: Copolymer represented by formula (A)-2 shown below, wherein a2:b2:c2=4:4:2 (molar ratio), Mw=10,000, Mw/Mn=2.0

(B)-1: Compound represented by formula (B)-1 shown below (B)-2: triphenylsulfonium nonafluorobutanesulfonate (D)-1: triethanolamine (S)-1: mixed solvent of PGMEA/EL=8/2 (weight ratio)

[Chemical Formula 31]

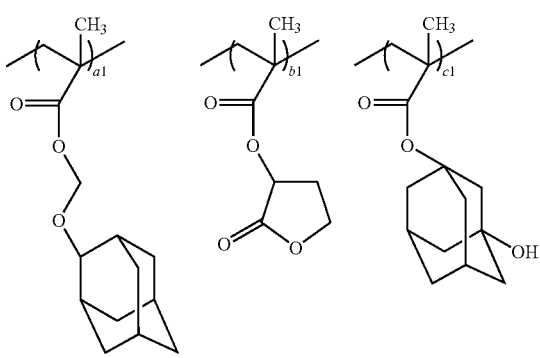

(A)-1

[Chemical Formula 32]

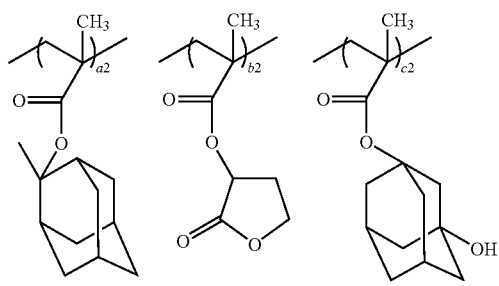

(A)-2

[Chemical Formula 33]

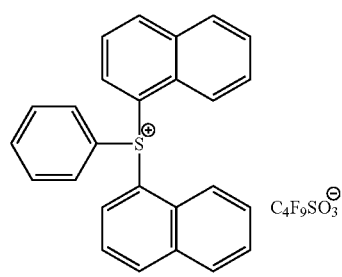

(B)-1

[Evaluation of LWR]

Using a spinner, the positive resist composition solution was uniformly applied onto an 8-inch substrate having a nitrogen-containing layer including silicon nitride (SiN) formed thereon (SiN substrate). Then, prebaking was conducted on a hot plate at a temperature (PAB temperature) of 110° C. for 90 seconds to dry the positive resist composition, thereby forming a resist film having a thickness of 190 nm.

Subsequently, using an ArF exposure apparatus XT1250 (manufactured by ASML; numerical aperture (NA)=0.85), the resist film was subjected to selective exposure through a mask pattern.

Thereafter, the resist film was subjected to post exposure bake (PEB) at a PEB temperature of 110° C. for 90 seconds, followed by development for 30 seconds at 23° C. in a developing solution (2.38% by weight aqueous solution of tetramethylammonium hydroxide). Then, the resulting resist film was rinsed with pure water for 30 seconds, followed by drying, thereby forming a line and space pattern with 80 run 1:1 line and space.

The line width of the formed resist pattern was measured at 5 points in the lengthwise direction of the line using a measuring SEM ((product name: S-9220, manufactured by Hitachi, Ltd.)), and from the results, the value of 3 times the standard deviation s (i.e., 3s) was calculated as a yardstick of LWR. The smaller this 3s value is, the lower the level of roughness of the line width, indicating that a resist pattern with a uniform width was obtained. The results are shown in Table 2.

TABLE 2

| | PAB (° C.) | PEB (° C.) | LWR (3s, nm) |
|---|---|---|---|
| Example 1 | 110 | 110 | 7.2 |
| Comparative Example 1 | 110 | 110 | 8.6 |
| Comparative Example 2 | 130 | 130 | 7.7 |

From the results shown in Table 2, it was confirmed that in Example 1 according to the present invention, a resist pattern having excellent shape with reduced LWR could be obtained, as compared to Comparative Example 1 in which a component (B) outside the scope of the present invention was used and Comparative Example 2 in which a component (A) outside the scope of the present invention was used.

INDUSTRIAL APPLICABILITY

According to the present invention, there are provided a positive resist composition and method of forming a resist pattern which enable formation of a resist pattern having excellent shape with reduced LWR. Therefore, the present invention is extremely useful in industry.

The invention claimed is:

1. A positive resist composition comprising a resin component (A) which exhibits increased alkali solubility under action of acid and an acid-generator component (B) which generates acid upon irradiation, said resin component (A) having a structural unit (a1) which is at least one member selected from the group consisting of structural units represented by general formula (a1-2) or (a1-4) shown below:

[Chemical Formula 1]

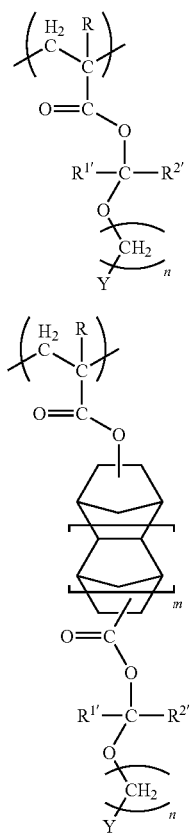

(a1-2)

(a1-4)

wherein Y represents a lower alkyl group or an aliphatic cyclic group; n represents an integer of 0 to 3; m represents 0 or 1; R represents a hydrogen atom, a halogen atom, a lower alkyl group or a halogenated lower alkyl group; and $R^{1\prime}$ and $R^{2\prime}$ each independently represents a hydrogen atom or a lower alkyl group; and said acid-generator component (B) comprising an acid generator (B1) having a cation moiety represented by general formula (b-5) shown below:

[Chemical Formula 2]

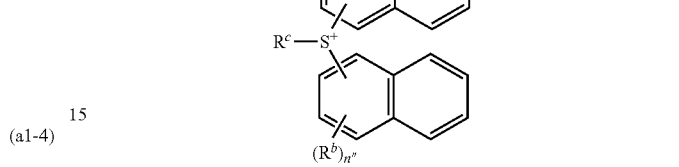

(b-5)

wherein $R^a$ and $R^b$ each independently represents an alkyl group, an alkoxy group, a halogen atom or a hydroxyl group; $R^c$ represents an aryl group or alkyl group which may or may not have a substituent; and n' and n" each independently represents an integer of 0 to 3.

2. The positive resist composition according to claim 1, wherein said resin component (A) has a structural unit (a2) derived from an acrylate ester having a lactone-containing cyclic group.

3. The positive resist composition according to claim 1, wherein said resin component (A) has a structural unit (a3) derived from an acrylate ester having a polar group-containing aliphatic hydrocarbon group.

4. The positive resist composition according to claim 1, which further comprises a nitrogen-containing organic compound (D).

5. A method of forming a resist pattern, comprising: applying a positive resist composition of claim 1 to a substrate to form a resist film on the substrate; conducting exposure of said resist film; and developing said resist film to form a resist pattern.

* * * * *